United States Patent
Su et al.

(12)

(10) Patent No.: US 11,658,226 B2
(45) Date of Patent: May 23, 2023

(54) BACKSIDE GATE CONTACT

(71) Applicant: Taiwan Semiconductor Manufacturing Company, Ltd., Hsinchu (TW)

(72) Inventors: Huan-Chieh Su, Changua County (TW); Chun-Yuan Chen, HsinChu (TW); Li-Zhen Yu, Hsinchu (TW); Lin-Yu Huang, Hsinchu (TW); Lo-Heng Chang, Hsinchu (TW); Cheng-Chi Chuang, New Taipei (TW); Chih-Hao Wang, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 74 days.

(21) Appl. No.: 17/228,955

(22) Filed: Apr. 13, 2021

(65) Prior Publication Data

US 2022/0271138 A1    Aug. 25, 2022

Related U.S. Application Data

(60) Provisional application No. 63/151,228, filed on Feb. 19, 2021.

(51) Int. Cl.
*H01L 29/423* (2006.01)
*H01L 29/06* (2006.01)
(Continued)

(52) U.S. Cl.
CPC ............ *H01L 29/42392* (2013.01); *H01L 21/823475* (2013.01); *H01L 29/0665* (2013.01); *H01L 29/42356* (2013.01); *H01L 29/78696* (2013.01)

(58) Field of Classification Search
CPC ......... H01L 29/42392; H01L 29/42356; H01L 29/0673; H01L 29/78696
See application file for complete search history.

(56) References Cited

U.S. PATENT DOCUMENTS

2022/0139911 A1* 5/2022 Wei .................. H01L 29/6681
257/365

FOREIGN PATENT DOCUMENTS

| KR | 20170093099 A | 8/2017 |
|---|---|---|
| KR | 101888369 B1 | 8/2018 |

(Continued)

OTHER PUBLICATIONS

Yi-Bo Liao et al., "Source/Drain Contact Structure", U.S. Appl. No. 17/093,230, filed Nov. 9, 2020, Assignee: Taiwan Semiconductor Manufacturing Co., Ltd., 50 pages specification, 57 pages drawings.
(Continued)

*Primary Examiner* — Changhyun Yi
(74) *Attorney, Agent, or Firm* — Haynes and Boone, LLP

(57) ABSTRACT

Semiconductor structures and methods of forming the same are provided. A semiconductor structure according to one embodiment includes first nanostructures, a first gate structure wrapping around each of the first nanostructures and disposed over an isolation structure, and a backside gate contact disposed below the first nanostructures and adjacent to the isolation structure. A bottom surface of the first gate structure is in direct contact with the backside gate contact.

20 Claims, 21 Drawing Sheets

(51) Int. Cl.
*H01L 21/8234* (2006.01)
*H01L 29/786* (2006.01)

(56) References Cited

FOREIGN PATENT DOCUMENTS

| KR | 20190036521 A | 4/2019 |
| KR | 2019007674 A | 6/2019 |
| KR | 20200054858 A | 5/2020 |
| TW | 202101705 A | 1/2021 |

OTHER PUBLICATIONS

Lung-Kun Chu et al., "Self-Aligned Backside Source Contact Structure", U.S. Appl. No. 17/106,109, filed Sep. 9, 2020, Assignee: Taiwan Semiconductor Manufacturing Co., Ltd., 31 pages specification, 17 pages drawings.

Huan-Chieh Su et al., "Backside Power Rail and Methods of Forming the Same", U.S. Applicaiton No. U.S. Appl. No. 16/901,963 fled Jun. 15, 2020, Assignee: Taiwan Semiconductor Manufacturing Co., Ltd., 29 pages specification, 22 pages drawings.

Pei-Wei Wang et al.; Method of Forming Backside Power Rails, U.S. Appl. No. 17/037,274, filed Sep. 29, 2020, Assignee: Taiwan Semiconductor Manufacturing Company, Ltd., 29 pages specification, 16 pages drawings.

\* cited by examiner

BACKSIDE GATE CONTACT

PRIORITY DATA

This application claims priority to U.S. Provisional Patent Application No. 63/151,228, filed on Feb. 19, 2021, entitled "Backside Gate Contact", the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In IC design, a plurality of devices may be grouped together as a cell or a standard cell to perform certain circuit functions. Such a cell or a standard cell may perform logic operations, such as NAND, AND, OR, NOR, or inverter, or serves as a memory cell, such as a static random access memory (SRAM) cell. The number of metal lines to interconnect a cell is a factor to determine the size of the cell, such as a cell height. Some existing technologies have included backside source/drain contacts as an effort to reduce frontside metal lines. While existing contact structures to semiconductor devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
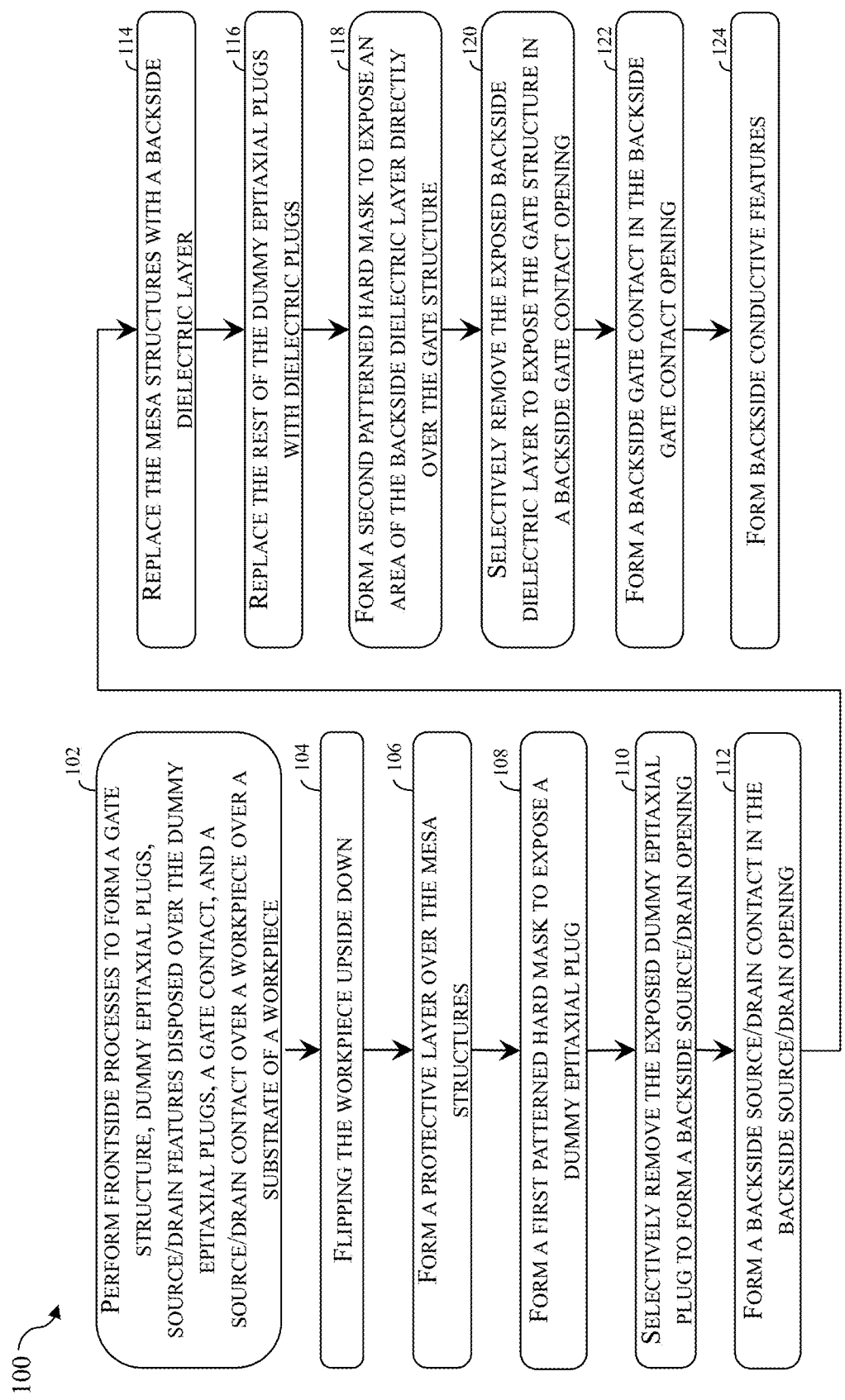
FIG. 1 illustrates a flow chart of a method for forming a semiconductor device having a backside contact, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. A fin-type FET (finFET) and a multi-bridge-channel (MBC) transistor are examples of multi-gate devices. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. However, shrinking the dimensions of the multi-gate devices is only one piece of the puzzle. As small and densely packing devices require interconnect structures with densely packed conductive features, reduction of the number of conductive features on one size of the substrate becomes another piece of the puzzle. Formation of densely packed conductive contacts may be challenging and the close proximity of adjacent conductive features may impact the device performance.

The present disclosure includes a semiconductor structure that includes backside contacts to the gate structures and the source/drain features to help in-cell routing and reduce the number of metal lines on the front side of a substrate. The processes to form the backside contacts to the gate structures and the source/drain features area readily integratable. In one embodiment, a semiconductor structure includes a backside gate contact (BVG) is in direct contact with a gate structure and a backside source contact (VB) is electrically coupled to a source feature. A backside conductive feature, such as a backside metal line, may be electrically coupled to one or more of the backside gate contacts and the backside source contacts.

The various aspects of the present disclosure will now be described in more detail with reference to the figures. In that regard, FIG. 1 is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-16, which are fragmentary perspective views or top views of a workpiece 200 at different stages of fabrication according to embodiments of method 100. Because the workpiece 200 will be fabricated into a semiconductor device or a semiconductor structure upon conclusion of the fabrication processes, the workpiece 200 may also be referred to as the semiconductor device 200 or a semiconductor structure 200 as the context requires. Additionally, throughout the present application, like reference numerals denote like features, unless otherwise excepted. Embodiments of the present disclosure, including method 100, are described with respect to a semiconductor structure that includes MBC transistors. However, the present disclosure is not so limited and may be applicable to semiconductor structures that includes other types of multi-gate devices, such as finFETs.

Figure 2:
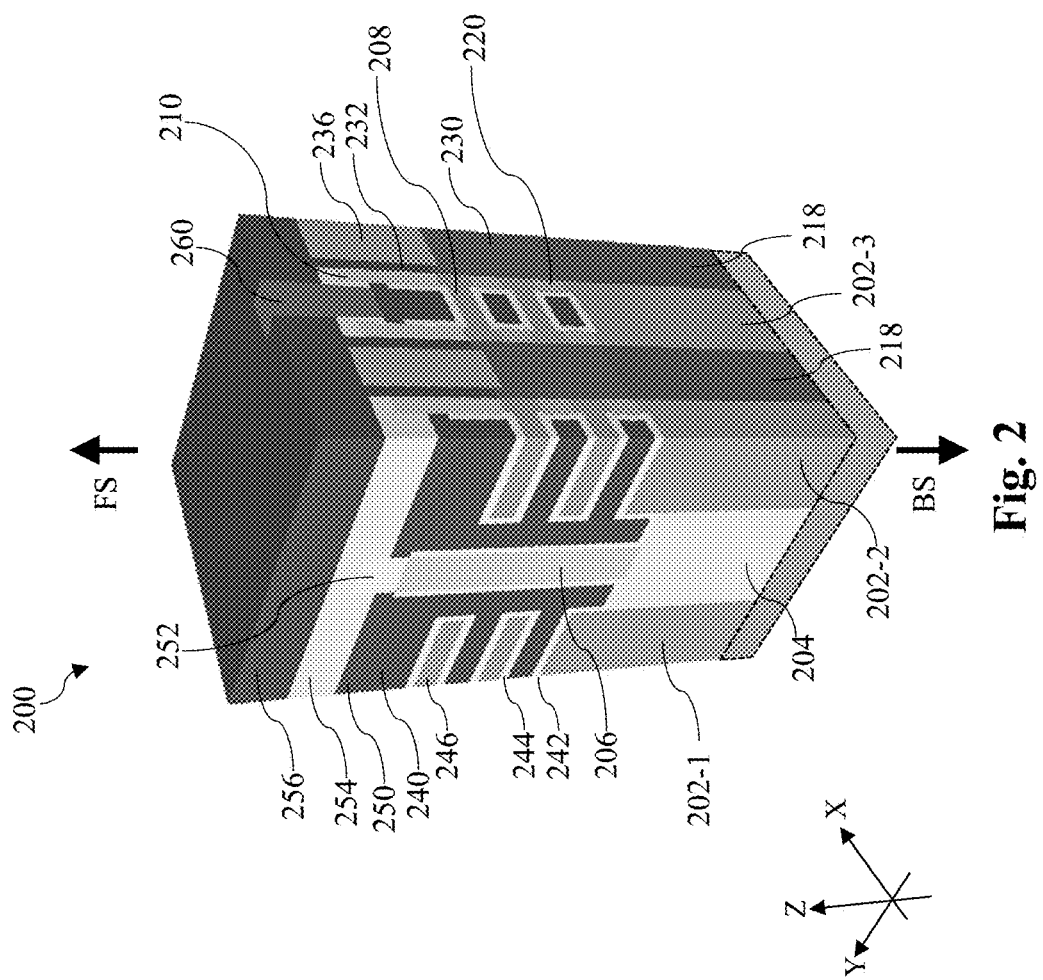
FIGS. 2-16 illustrate fragmentary perspective views or fragmentary top views of a workpiece during a fabrication process according to the method of FIG. 1, according to one or more aspects of the present disclosure.

Referring to FIGS. 1 and 2, method 100 includes a block 102 where a workpiece 200 is received. FIG. 2 illustrates a workpiece 200 with a front side FS facing up and a back side BS facing down. The workpiece 200 has received front side processes and includes various features. In the embodiments represented in FIG. 2, the workpiece 200 includes a substrate 202. In one embodiment, the substrate 202 includes silicon (Si). In other embodiments, the substrate 202 may also include other semiconductor materials such as germanium (Ge), silicon carbide (SiC), silicon germanium (SiGe), III-V semiconductors, or diamond. The workpiece 200 includes various mesa structures, such as a first mesa structure 202-1, a second mesa structure 202-2, or a third mesa structure 202-3, each of which is patterned from the substrate 202 and may share the same composition as the substrate 202. While the substrate 202 is shown in FIG. 2, it may be omitted in other figures as the bulk substrate 202 may be thinned or ground down in the beginning of the backside processes. Referring to FIG. 2, the first mesa structure 202-1 and the second mesa structure 202-2 are spaced apart from one another by an isolation feature 204. In some embodiments, the isolation feature 204 is deposited in trenches that are formed in the substrate 202. The isolation feature 204 may also be referred to as a shallow trench isolation (STI) feature 204. The isolation feature 204 may include silicon oxide, silicon nitride, silicon oxynitride, fluorine-doped silicate glass (FSG), a low-k dielectric, combinations thereof, and/or other suitable materials.

Referring to FIG. 2, the workpiece 200 includes a plurality of vertically stacked channel members 208 (or nanostructures 208). Each of the channel members 208 may come in different nano-scale shapes or structures, such as nanowires, nanosheets, or nanorods. In the depicted embodiments, vertically stacked channel members 208 are disposed over each of the first mesa structure 202-1, the second mesa structure 202-2, and the third mesa structure 202-3 as shown in FIG. 2. On the same vertical level, the spacing between a channel member 208 over the first mesa structure 202-1 and a channel member 208 over the second mesa structure 202-2 may be between about 14 nm and about 50 nm. This spacing may also be referred to a spacing between adjacent active regions. Along the Z direction, each of the channel members 208 may have a thickness between about 4 nm and about 12 nm. The channel members 208 may be formed of a semiconductor material that is similar to the material of the substrate 202. In one embodiments, the channel members 208 may include silicon (Si). Each of the channel members 208 are wrapped around by a gate structure 240 that extends along the Y direction. Each of the gate structures 240 may include an interfacial layer 242, a gate dielectric layer 244 over the interfacial layer 242 and a gate electrode layer 246 over the gate dielectric layer 244. In some embodiments, the interfacial layer 242 includes silicon oxide. The gate dielectric layer 244 may also be referred to a high-k dielectric layer, as it is formed of a dielectric material having a dielectric constant greater than that of silicon dioxide, which is about 3.9. In one embodiment, the gate dielectric layer 244 may include hafnium oxide. Alternatively, the gate dielectric layer 244 may include other high-K dielectrics, such as titanium oxide ($TiO_2$), hafnium zirconium oxide (HfZrO), tantalum oxide ($Ta_2O_5$), hafnium aluminum oxide (HfAlO), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide ($ZrO_2$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The gate electrode layer 246 may include a single layer or alternatively a multi-layer structure, such as various combinations of a metal layer with a selected work function to enhance the device performance (work function metal layer), a liner layer, a wetting layer, an first adhesion layer, a metal alloy or a metal silicide. By way of example, the gate electrode layer 246 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In FIG. 2, each of the gate structures 240 is disposed over a mesa structure and the isolation feature 204.

Referring to FIGS. 2, the workpiece 200 includes a gate spacer 210 disposed along sidewalls of the gate structures 240 above the topmost channel member 208 or above the isolation feature 204. The gate spacer 210 may be a single layer or a multilayer. In some embodiments, the gate spacer 210 may include silicon oxide, silicon nitride, silicon carbide, silicon oxynitride, silicon carbonitride, silicon oxycarbide, silicon oxycarbonitride, and/or combinations thereof. Between two adjacent channel members 208, sidewalls of the gate structures 240 are lined by inner spacer features 220. The inner spacer features 220 may include silicon oxide, silicon nitride, silicon oxycarbide, silicon oxycarbonitride, silicon carbonitride, metal nitride, or a suitable dielectric material. Each vertical stack of channel members 208 extend between two source/drain features 230. One end surface of each of the channel members 208 is coupled to one source/drain feature 230 and the other end surface of each of the channel members 208 is coupled to another source/drain feature 230. Depending on the conductivity type of the to-be-formed MBC transistor, the source/drain features 230 may be n-type or p-type. When they are n-type, they may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). When they are p-type, they may include germanium (Ge), gallium-doped silicon germanium (SiGe: Ga), boron-doped silicon germanium (SiGe:B), or other suitable material and may be in-situ doped during the epitaxial process by introducing a p-type dopant, such as boron (B) or gallium (Ga).

The workpiece 200 also includes a contact etch stop layer (CESL) 232 disposed over the source feature 230S and the drain feature 230D and an interlayer dielectric (ILD) layer (not shown) disposed over the CESL 232. The CESL 232 may include silicon nitride, silicon oxynitride, and/or other materials known in the art. The ILD layer may include materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicate glass (BSG), and/or other suitable dielectric materials. The source/drain features 230 in the workpiece 200 may be disposed directly over a dummy epitaxial plug 218 or a sacrificial plug 218. Each of the sacrificial plugs 218 extends through the substrate 202 as well as the isolation feature 204. Along the X direction, each of the sacrificial plugs 218 is sandwiched between two mesa structures. Along the Y direction, the sacrificial plug 218 is sandwiched between two portions of the isolation feature 204 (one shown). In some embodiments, the sacrificial plug 218 may be formed of undoped silicon germanium (SiGe). Along the Z direction, the sacrificial plug 218 may have a height between about 25 nm and about 100 nm. In some embodiments, composition of the sacrificial plugs 218 and the source/drain features 230 are selected such that the sacrificial plugs 218 may be selectively removed or etched without substantially damaging the source/drain features 230. For example, when an n-type MBC transistor is desired, the source/drain features 230 are formed of silicon (Si) doped with an n-type dopant and the sacrificial plugs 218 are formed of silicon germanium (SiGe). An etch process that etches the sacrificial plug 218 (formed of silicon germanium (SiGe)) may be slowed down when it etches the source/drain features due to the reduction of germanium (Ge) content. When a p-type MBC transistor is desired, the source/drain feature 230 is formed of silicon germanium (SiGe) doped with boron (B). An etch process that etches the sacrificial plug 218 (formed of silicon germanium) may be slowed down when it etches the source/drain feature 230 as the boron (B) dopant may reduce the etch rate.

In some embodiments represented in FIG. 2, the workpiece 200 includes a self-aligned capping (SAC) dielectric layer 254 disposed over the gate structures 240 and the gate spacers 210. The SAC layer 254 may be a single layer or a multi-layer and may include silicon oxide, silicon nitride, silicon carbide, silicon oxynitride, silicon carbonitride, silicon oxycarbide, silicon oxycarbonitride, and/or combinations thereof. The workpiece 200 may also include frontside source/drain contacts 236 over source/drain features 230. The frontside source/drain contacts 236 may include titanium nitride (TiN), tantalum (Ta), titanium (Ti), tantalum nitride (TaN), ruthenium (Ru), tungsten (W), cobalt (Co), nickel (Ni), copper (Cu), molybdenum (Mo) and may be electrically coupled to the source/drain features 230 by way of a silicide feature (not explicitly shown) disposed at the interface between a source/drain feature 230 and a frontside source/drain contact 236. The silicide feature may include titanium silicide (TiSi), tungsten silicide (WSi), platinum silicide (PtSi), cobalt silicide (CoSi), nickel silicide (NiSi), or a combination thereof. In some embodiments, the frontside source/drain contacts 236 are only formed over drain features.

Figure 20:
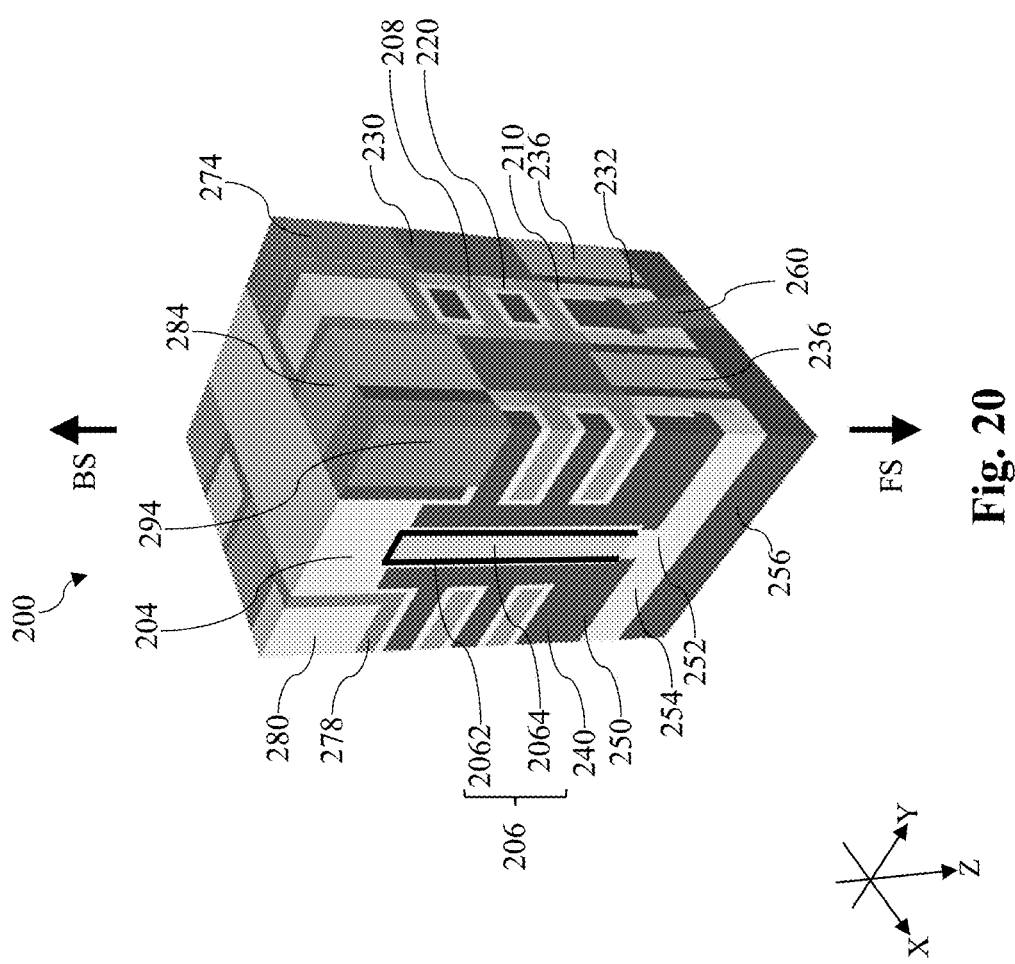

In some embodiments represented in FIG. 2, adjacent gate structures 240 or adjacent source/drain features 230 may be spaced apart by dielectric fin 206 along the Y direction. The dielectric fin 206 may be a single layer or a multi-layer and may have Y direction width between about 6 nm and about 26 nm. When the dielectric fin 206 is a single layer as shown in FIGS. 2-17, the dielectric fin 206 may include silicon nitride, silicon oxide, silicon oxynitride, silicon carbide, silicon oxycarbonitride, silicon, aluminum oxide, hafnium oxide, titanium oxide, zirconium oxide, yittrium oxide, zinc oxide, or a suitable dielectric material. When the dielectric fin 206 is a multi-layer as shown in FIG. 20, the dielectric fin 206 may include an outer layer 2062 and an inner layer 2064. In some embodiments, a dielectric constant of the outer layer 2062 is greater than the inner layer 2064. In some embodiments, the outer layer is formed of hafnium oxide, zirconium oxide, hafnium aluminum oxide, hafnium silicon oxide, aluminum oxide, or zinc oxide and the inner layer is formed of silicon oxide, silicon carbonitride, silicon oxycarbide, or silicon oxycarbonitride. The outer layer 2062 serves as an etch resistant layer to protect the inner layer 2064 and the inner layer 2064 functions to reduce parasitic capacitance. A portion of the gate structure 240 right between a channel member 208 and the adjacent dielectric fin 206 may be referred to a metal gate end cap. According to the present disclosure, a thickness of the metal gate end cap along the Y direction may be between about 4 nm and about 15 nm.

A gate top metal layer 250 may be disposed over each of the gate structures 240. The gate top metal layer 250 may include tungsten (W) and may serve to interconnect adjacent gate structures 240 when it is not severed by a gate cut feature 252. As shown in FIG. 2, the gate cut feature 252 may be disposed directly over the dielectric fin 206 such that they work collectively to electrically isolate two adjacent gate structures 240 (as well as the gate top metal layers 250 over them). The workpiece 200 also includes a dielectric layer 256 disposed over the frontside source/drain contacts 236 and the SAC layer 254. A frontside gate contact 260 extends through the dielectric layer 256 and the SAC layer 254 to be in direct contact with the gate top metal layer 250 to be electrically coupled to the same. The gate cut feature 252 may include silicon oxide, silicon nitride, silicon oxynitride. The dielectric layer 256 may be an interlayer dielectric (ILD) layer and may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicate glass (BSG), and/or other suitable dielectric materials. Along the Z direction, the gate cut feature 252 may have a height between about 6 nm and about 20 nm. In other words, the gate cut feature 252 may extend further into the gate top metal layer 250 and the SAC layer 254 than the gate structure 240 by as much as about 6 nm to about 20 nm. As measured from the gate top metal layer 250 to the isolation feature 204, the gate structure 240 may have a height between about 8 nm and about 30 nm.

Figure 21:
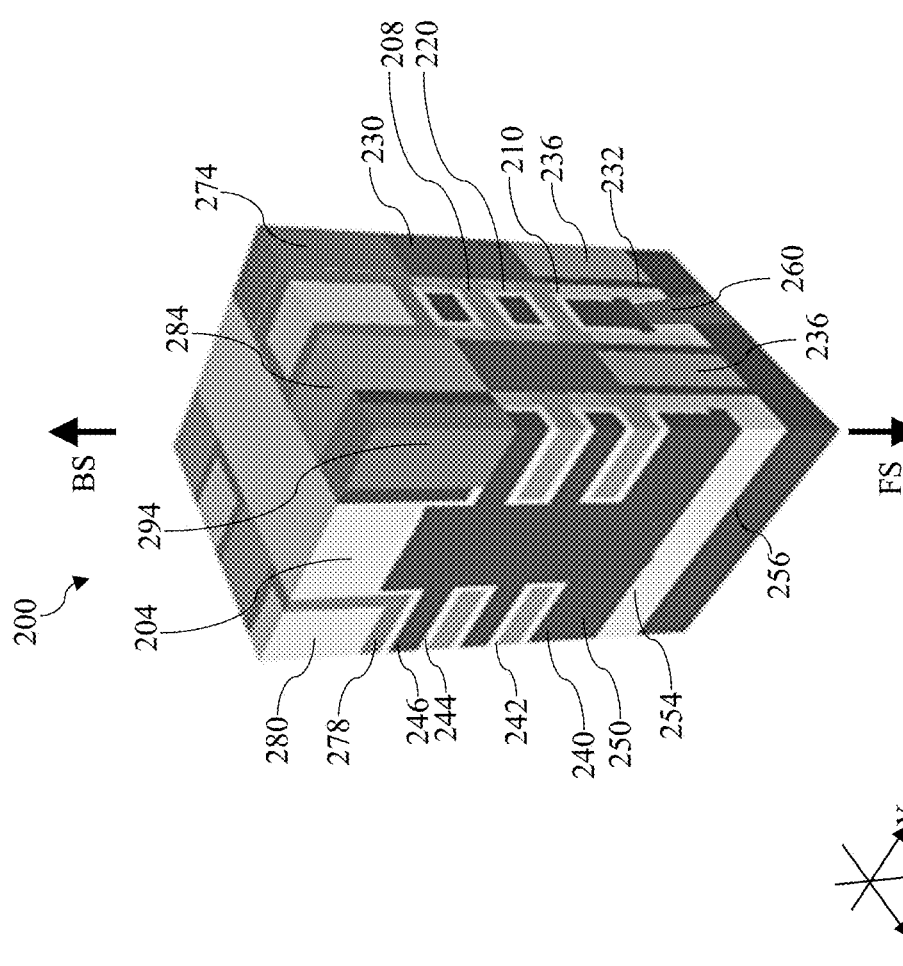

In some alternative embodiments shown in FIG. 21, the dielectric fin 206 is omitted from the workpiece 200 and the gate structures 240 that would be separated by the dielectric fin 206 in FIG. 2 may be a common or connected gate structure that wrap around two different vertical stacks of channel members 208 disposed over two mesa structures. That is, the common or connect gate structure may be configured to activate two MBC transistors, instead of one.

Figure 3:
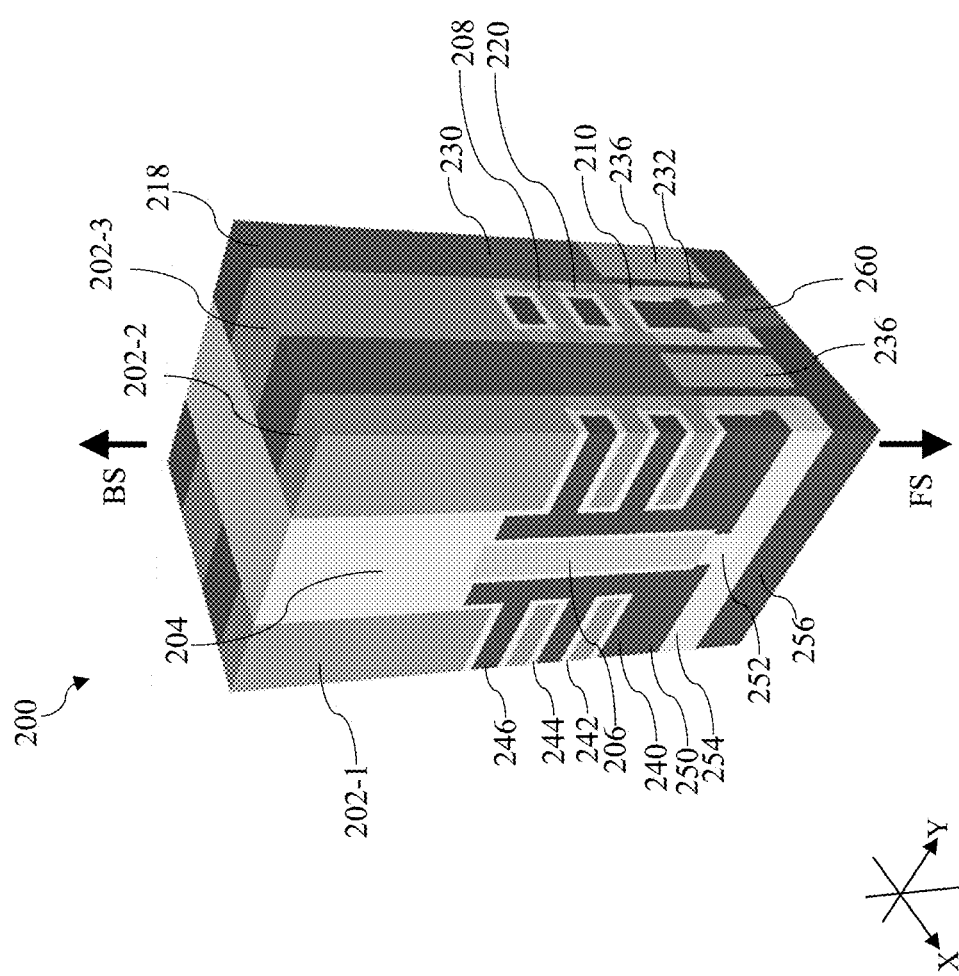

Referring to FIGS. 1 and 3, method 100 includes a block 104 where the workpiece 200 is flipped upside down. To flip the workpiece 200 up-side-down, a carrier substrate (not explicitly shown) is bonded to the front side FS of the workpiece 200 away from the substrate 202. In some embodiments, the carrier substrate may be bonded to the workpiece 200 by fusion bonding, by use of an adhesion layer, or a combination thereof. In some instances, the carrier substrate may be formed of semiconductor materials (such as silicon), sapphire, glass, polymeric materials, or other suitable materials. In embodiments where fusion bonding is used, the carrier substrate includes a bottom oxide layer and the workpiece 200 includes a top oxide layer. After both the bottom oxide layer and top oxide layer are treated, they are placed in flush contact with one another for direct bonding at room temperature or at an elevated temperature. Once the carrier substrate is bonded to the workpiece 200, the workpiece 200 is flipped over, as shown in FIG. 3. After the workpiece 200 is flipped over, the back side BS of the workpiece 200 is thinned by grinding and planarization techniques until the isolation feature 204, the sacrificial plugs 218, the first mesa structure 202-1, the second mesa structure 202-2, and the third mesa structure 202-3 are exposed on the back side BS of the workpiece 200, which is now facing up.

Figure 4:
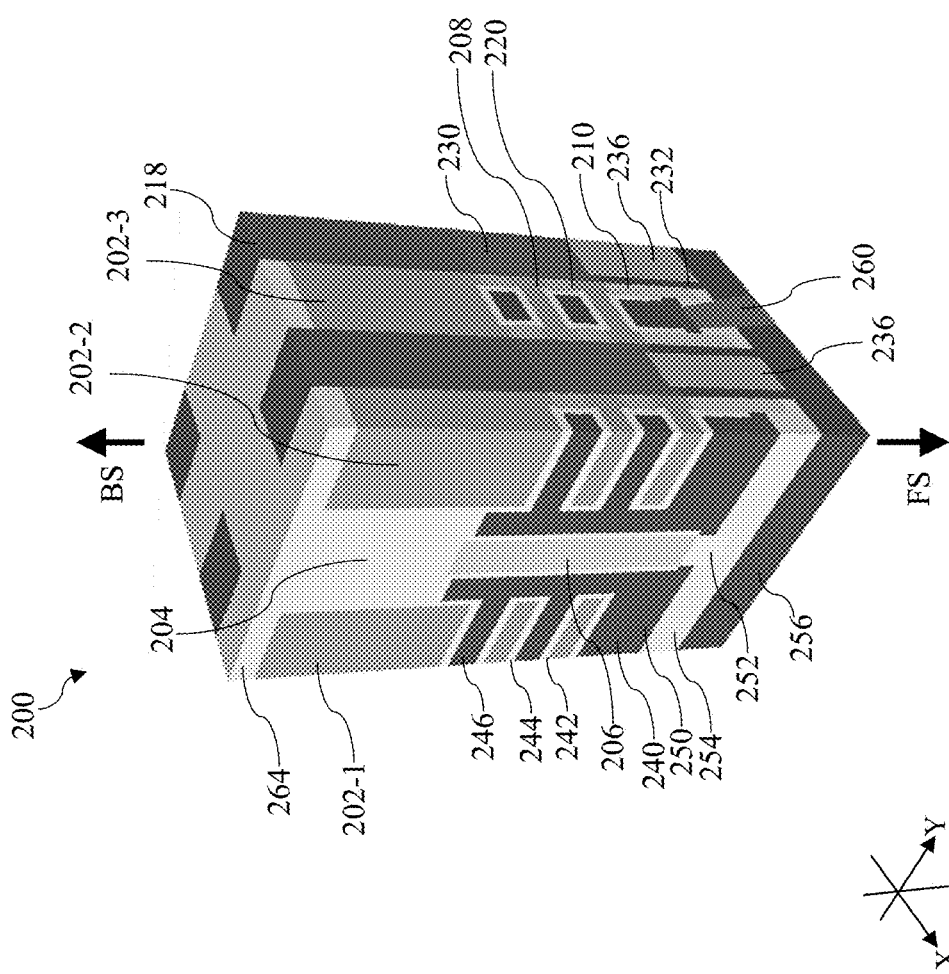

Referring to FIGS. 1 and 4, method 100 includes a block 106 where a protective layer 264 is selectively formed over the mesa structures, such as the first mesa structure 202-1, the second mesa structure 202-2, or the third mesa structure 202-3. In an example process, the mesa structures, such as the first mesa structure 202-1, the second mesa structure 202-2, and the third mesa structure 202-3, are selectively etched back, a dielectric material is deposited over the back side BS of the workpiece 200, and a planarization process is performed to form the protective layer 264 over the mesa structures. In some embodiments, the etch back at block 106 may be performed using a selective etch process, such as a selective wet etch process or a selective dry etch process An example selective wet etch process to etch back the mesa structures may include use of ethylenediamine pyrocatechol (EDP), tetramethylammonium hydroxide (TMAH), nitric acid ($HNO_3$), hydrofluoric acid (HF), ammonia ($NH_3$), hydrogen peroxide ($H_2O_2$), ammonium fluoride ($NH_4F$) or a suitable wet etchant. An example selective dry etch process to etch back the mesa structures may include sulfur hexafluoride ($SF_6$), hydrogen ($H_2$), ammonia ($NH_3$), hydrogen fluoride (HF), carbon tetrafluoride ($CF_4$), hydrogen bromide (HBr), argon, or a mixture thereof. In some implementations, the etch back is time controlled to etch back the mesa structures by a depth between about 5 nm and about 30 nm. After the etch back, a dielectric material, such as silicon oxide, may be deposited over the back side BS of the workpiece 200. A planarization process, such as a chemical mechanical polishing (CMP) process, is performed to remove excess dielectric material over the sacrificial plugs 218. In some embodiments, the protective layer 264 may have a composition similar to the isolation feature 204. In one embodiment, the protective layer 264 is formed of silicon oxide and may have a thickness between about 5 nm and about 30 nm, along the Z direction.

Figure 5:
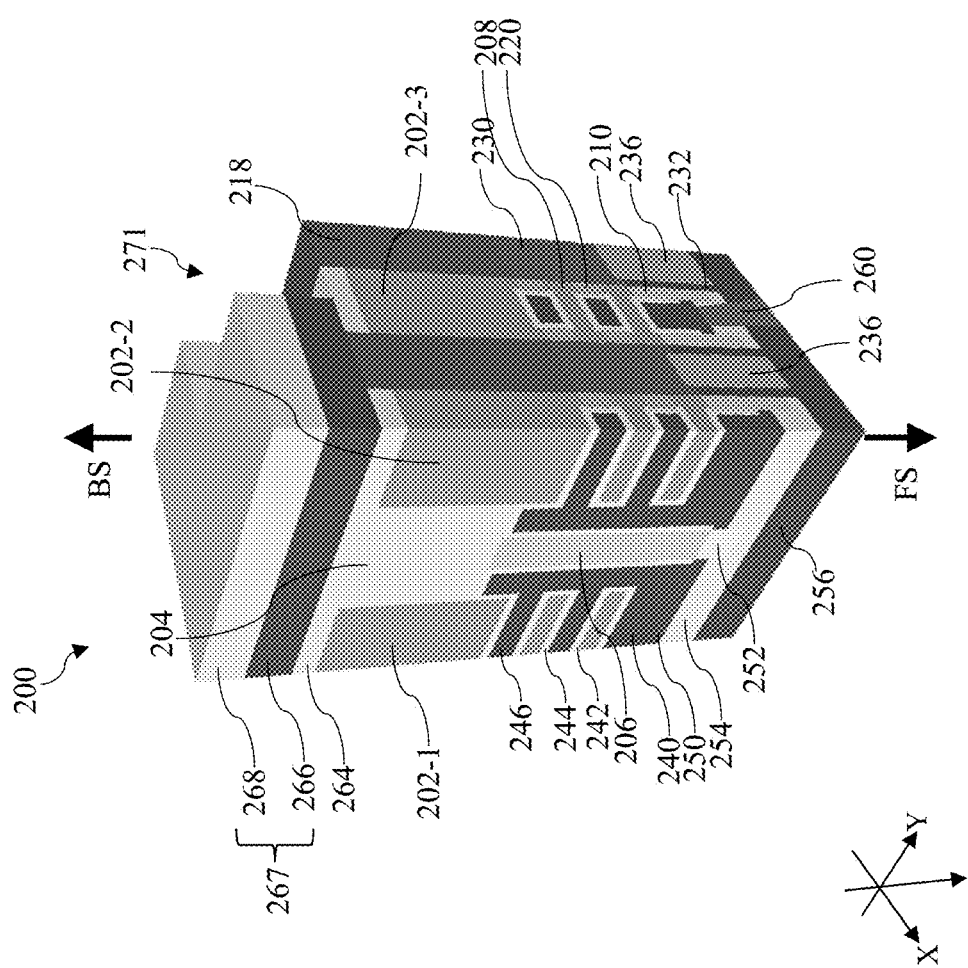

Referring to FIGS. 1 and 5, method 100 includes a block 108 where a first patterned hard mask 267 is formed to expose a sacrificial plug 218. In an example process, a first hard mask layer 267 is blanketly deposited over the back side BS of the workpiece 200 using CVD. The first hard mask layer 267 may be a single layer or a multi-layer. In the depicted embodiment, the first hard mask layer 267 is a multi-layer and may include a nitride layer 266 and an oxide layer 268 over the nitride layer 266. After a deposition of the first hard mask layer 267, photolithography and etch processes may be performed to pattern the first hard mask layer 267 to form the first patterned hard mask 267 to expose a sacrificial plug 218. In some instances, a photoresist layer is deposited over the first hard mask layer 267. To pattern the photoresist layer, the photoresist layer is exposed to radiation reflected from or transmitting through a photomask, baked in a post-exposure bake process, and developed in a developer. The patterned photoresist layer is then applied as an etch mask to etch the first hard mask layer 267, thereby forming the first patterned hard mask 267. Referring to FIGS. 5, the first patterned hard mask 267 includes a first mask opening 271 that is substantially aligned with the to-be-formed first backside source/drain contact opening 272 (described below). According to the present disclosure, the first patterned hard mask 267 functions to mask off sacrificial plugs 218 that are not to be etched at block 108. It does not matter if a portion of the protective layer 264 is exposed in the first mask opening 271. As shown in FIG. 5, the first mask opening 271 may not be coterminous with portions of the protective layer 264 on the mesa structures. This is so because the etch process at block 110 is selective to the sacrificial plugs 218.

Figure 6:
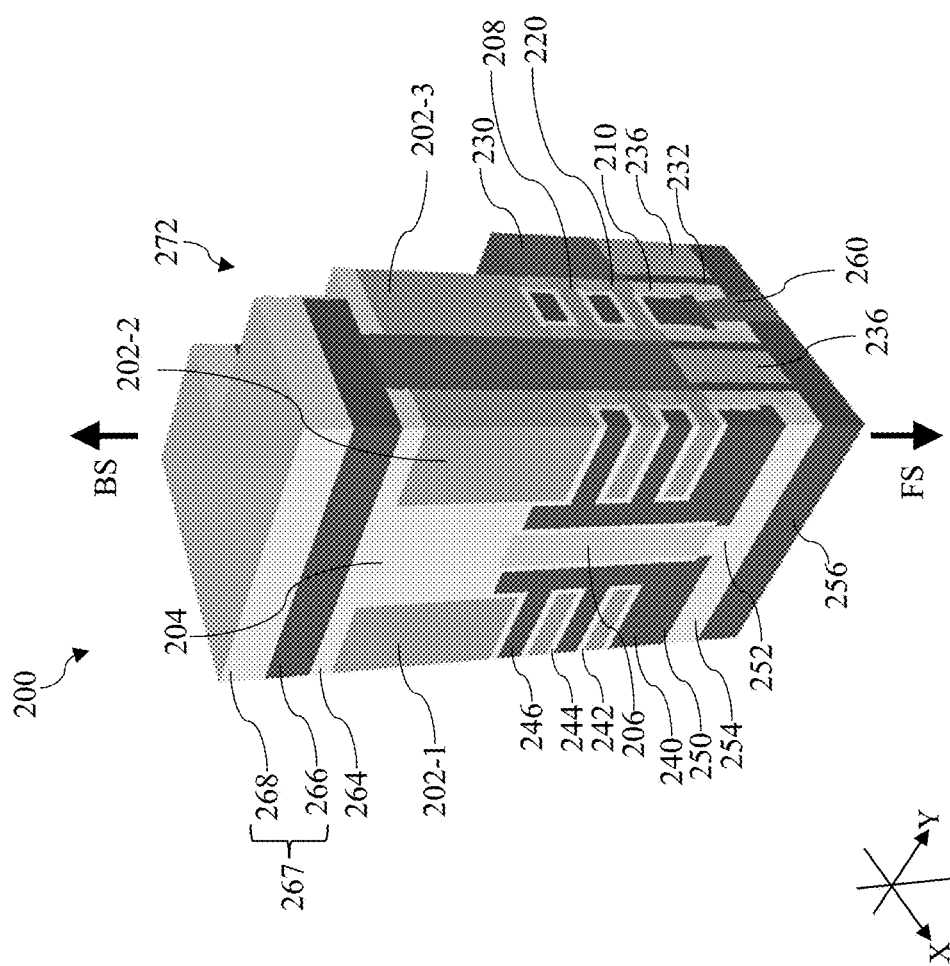

Referring to FIGS. 1 and 6, method 100 includes a block 110 where the exposed sacrificial plug 218 is selectively removed to form a first backside source/drain contact opening 272. In some embodiments, the removal of the sacrificial plug 218 may be self-aligned because the sacrificial plug 218, which is formed of silicon germanium (SiGe), is disposed among the isolation feature 204 (formed of a dielectric material) and the protective layer 264, which may be formed of silicon oxide. In these embodiments, the selective removal of the sacrificial plug 218 may be performed using a selective wet etch process. An example selective wet etch process may include use of a solution of ammonium hydroxide ($NH_4OH$) and hydrogen peroxide ($H_2O_2$). Because the selective etch process at block 110 etches the sacrificial plug 218 faster than it etches the isolation feature 204 or the protective layer 264, the sacrificial plug 218 may be removed with little or no damages to the isolation feature 204 or the protective layer 264. In the depicted embodiments, the selective removal of the sacrificial plug 218 may also remove a portion of the exposed source/drain feature under the sacrificial plug 218. The removal of the sacrificial plug 218 forms a first backside source/drain contact opening 272 to expose the source/drain features 230.

Figure 7:
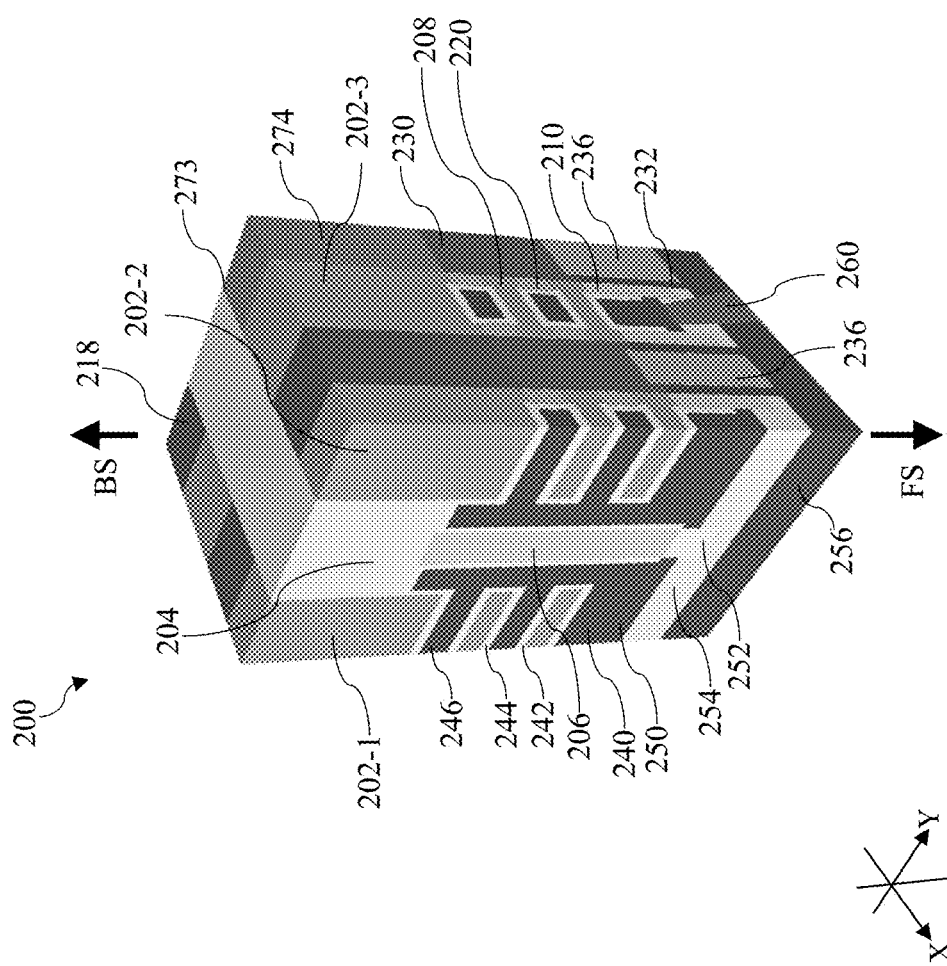
Figure 18:
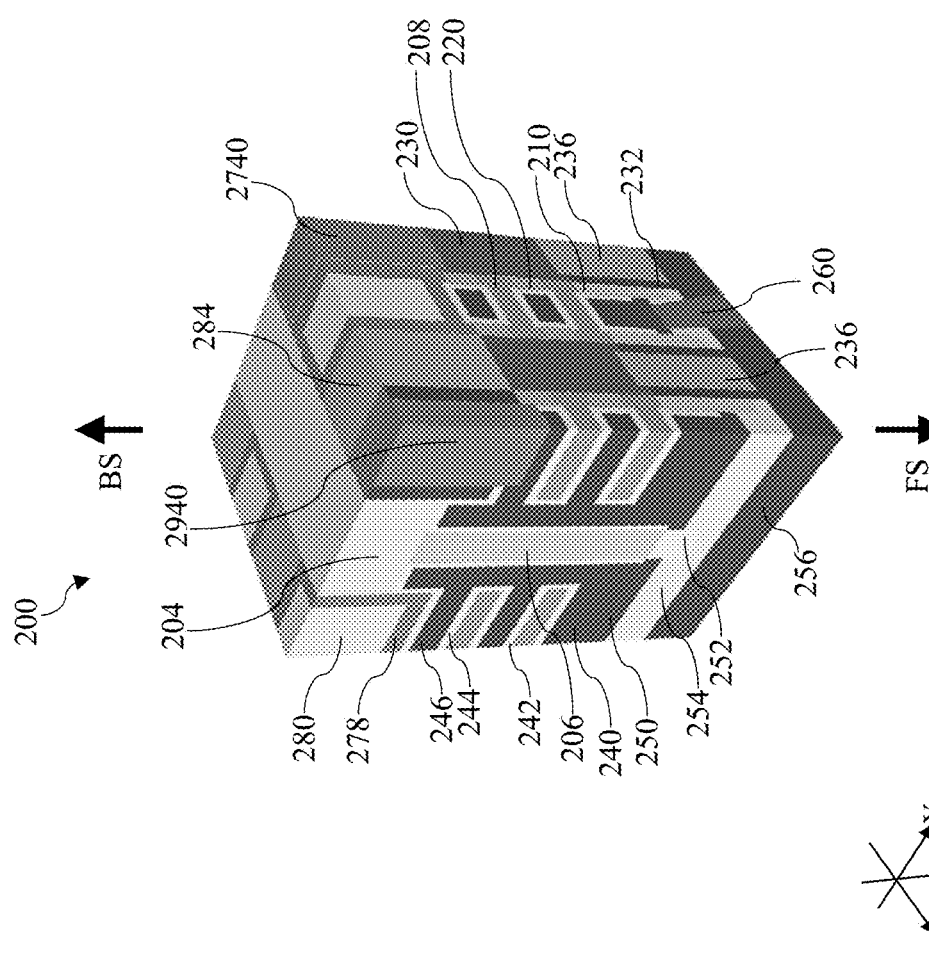

Referring to FIGS. 1 and 7, method 100 includes a block 112 where a backside source/drain contact 274 is formed in the first backside source/drain contact opening 272. Although not explicitly shown, each of the backside source/drain contacts 274 may include a silicide layer 275 (not shown in FIG. 7 but shown in FIG. 17) to interface the source/drain feature 230 and a metal fill layer disposed over the silicide layer 275. In an example process, after the formation of the first backside source/drain contact opening 272, a metal precursor is deposited over the exposed source/drain feature 230 and an anneal process is performed to bring about silicidation between the source/drain feature 230 and the metal precursor to form the silicide layer. In some embodiments, the metal precursor may include titanium (Ti), chromium (Cr), tantalum (Ta), molybdenum (Mo), zirconium (Zr), nickel (Ni), cobalt (Co), manganese (Mn), tungsten (W), iron (Fe), ruthenium (Ru), or platinum (Pt) and the silicide layer 275 may include titanium silicide (TiSi), chromium silicide (CrSi), tantalum silicide (TaSi), molybdenum silicide (MoSi), nickel silicide (NiSi), cobalt silicide (CoSi), manganese silicide (MnSi), tungsten silicide (WSi), iron silicide (FeSi), ruthenium silicide (RuSi), or platinum silicide (PtSi). In some instances, the silicide layer 275 may have a thickness between about 1 nm and about 10 nm. After the formation the silicide layer 275, a metal fill material may be deposited into the first backside source/drain contact opening 272 to form the backside source/drain contact 274, as shown in FIG. 7. The metal fill material may include tungsten (W), ruthenium (Ru), cobalt (Co), titanium (Ti), titanium nitride (TiN), tantalum (Ta), tantalum nitride (TaN), molybdenum (Mo), or nickel (Ni) and may be deposited using physical vapor deposition (PVD) or chemical vapor deposition (CVD). In some embodiments, the backside source/drain contact 274 may optionally include a barrier layer 273 disposed at its interface with the isolation feature 204 and its interface with the adjacent mesa structure. The optional barrier layer 273 may include silicon nitride, silicon carbonitride, silicon oxycarbide, silicon oxycarbonitride and may have a thickness between about 0.5 nm and about 5 nm. A planarization process, such as a CMP process, may follow the deposition of the metal fill material to remove excess materials and provide a planar top surface. Upon conclusion of the operations at block 112, the backside source/drain contact 274 is coupled to the source/drain features 230 and may have a height between about 6 nm and about 50 nm, as measured from the source/drain feature 230 to a backside conductive feature (described below). In one embodiment, the backside source/drain contact 274 is formed over a source/drain features 230 that functions as a source feature and may be referred to as backside source contact 274. In some alternative embodiments, the first backside source/drain contact opening 272 may partially extends into the source/drain feature 230. As a result, an extended backside source/drain contact 2740 shown in FIG. 18 may be formed.

Figure 8:
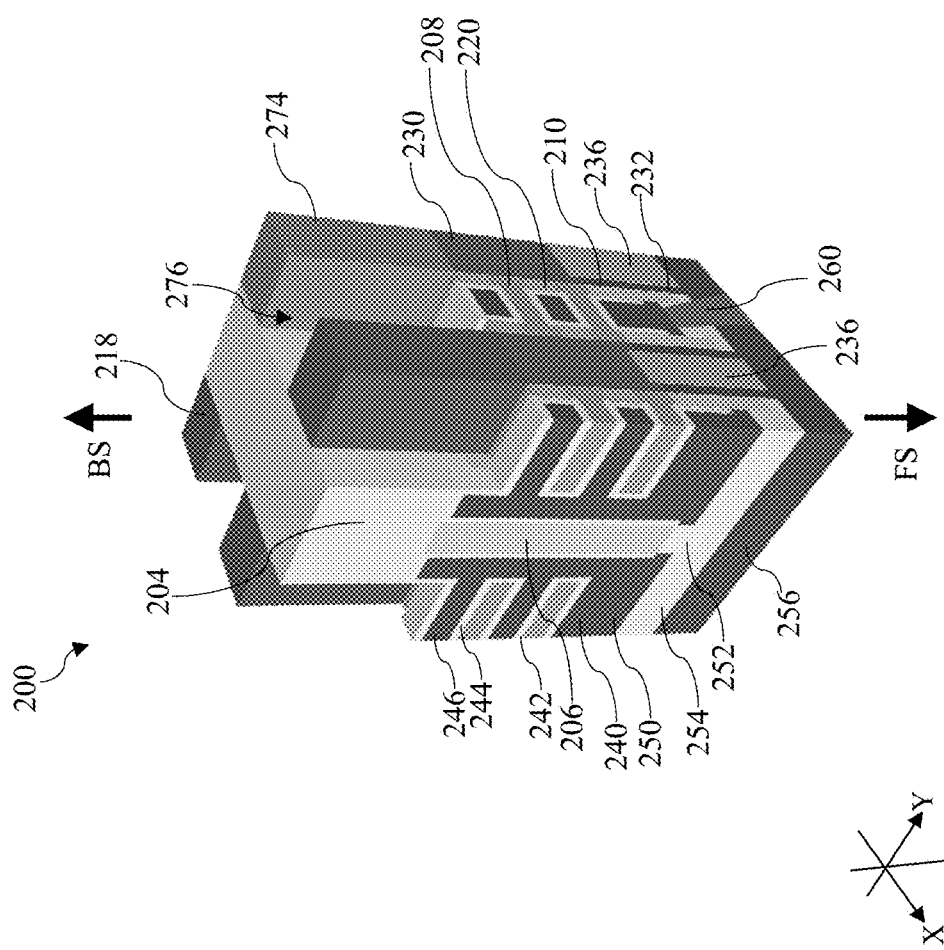
Figure 9:
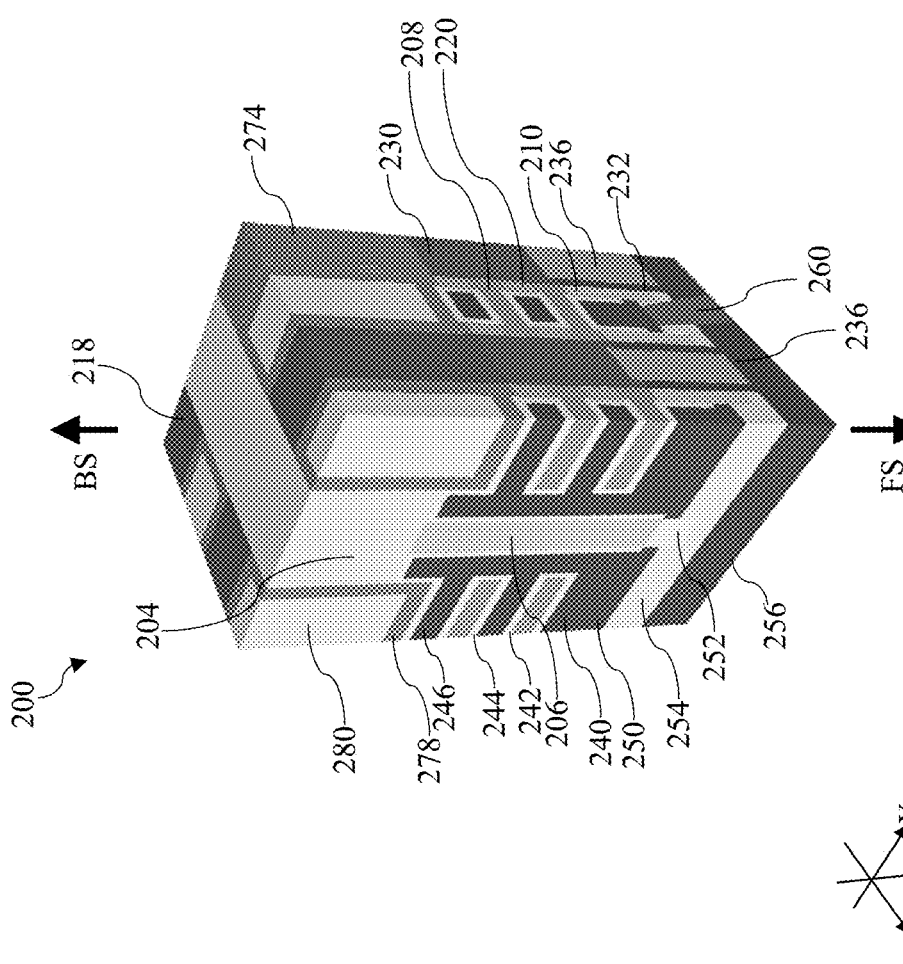

Referring to FIGS. 1, 8 and 9, method 100 includes a block 114 where the mesa structures are replaced with a liner 278 and a backside dielectric layer 280. Operations at block 114 may include selective removal of the mesa structures (shown in FIG. 8), deposition of the liner 278 and deposition of the backside dielectric layer 280 (shown in FIG. 9). Referring to FIG. 8, the mesa structures, such as the first mesa structure 202-1, the second mesa structure 202-2, and the third mesa structure 202-3, are first selectively removed using a selective wet etch process or a selective dry etch process. An example selective wet etch process to etch back the mesa structures may include use of ethylenediamine pyrocatechol (EDP), tetramethylammonium hydroxide (TMAH), nitric acid ($HNO_3$), hydrofluoric acid (HF), ammonia ($NH_3$), hydrogen peroxide ($H_2O_2$), ammonium fluoride ($NH_4F$) or a suitable wet etchant. An example selective dry etch process to etch back the mesa structures may include sulfur hexafluoride ($SF_6$), hydrogen ($H_2$), ammonia (NH3), hydrogen fluoride (HF), carbon tetrafluoride ($CF_4$), hydrogen bromide (HBr), argon, or a mixture thereof. As shown in FIG. 8, the removal of the mesa structures forms gate access openings 276 directly over the gates structures 240. Referring to FIG. 9, the liner 278 is deposited along sidewalls and bottom surfaces of the gate access openings 276. The liner 278 may include silicon nitride, silicon carbonitride, silicon oxycarbide, silicon oxycarbonitride and may have a thickness between about 0.5 nm and about 5 nm. A backside dielectric layer 280 is then deposited over the liner 278 and into the gate access openings 276. The backside dielectric layer 280 may include silicon oxide, silicon oxycarbonitride, silicon oxynitride, or silicon carbonitride and may be deposited using spin-on coating, chemical vapor deposition (CVD), Flowable CVD (FCVD), or plasma-enhanced CVD (PECVD). A planarization process, such as a CMP process, may be performed to remove excess materials such that top surfaces of the backside dielectric layer 280, the isolation feature 204, the sacrificial plugs 218, the liner 278, and the backside source/drain contact 274 are coplanar. Operations at block 114 may be collectively referred to as a de-mesa process. The replacement of silicon mesa structures with the liner 278 and the backside dielectric layer 280 may reduce Off-state leakage current into or via the bulk substrate 202.

Figure 10:
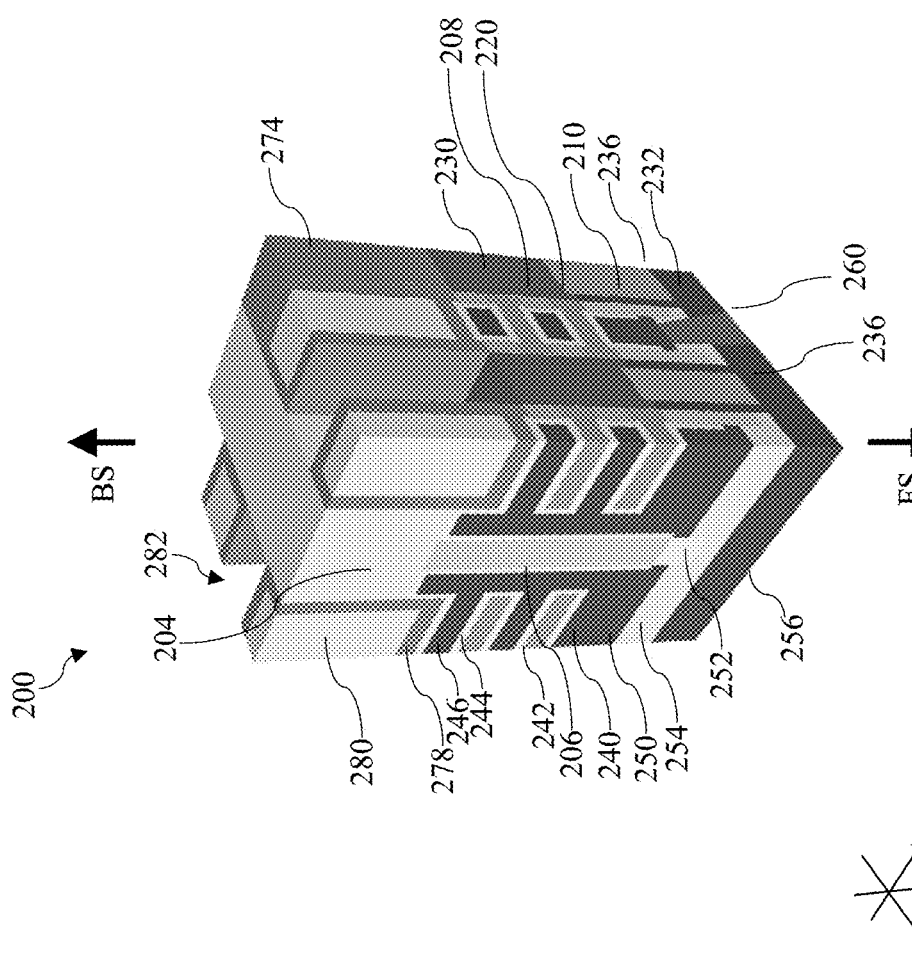
Figure 11:
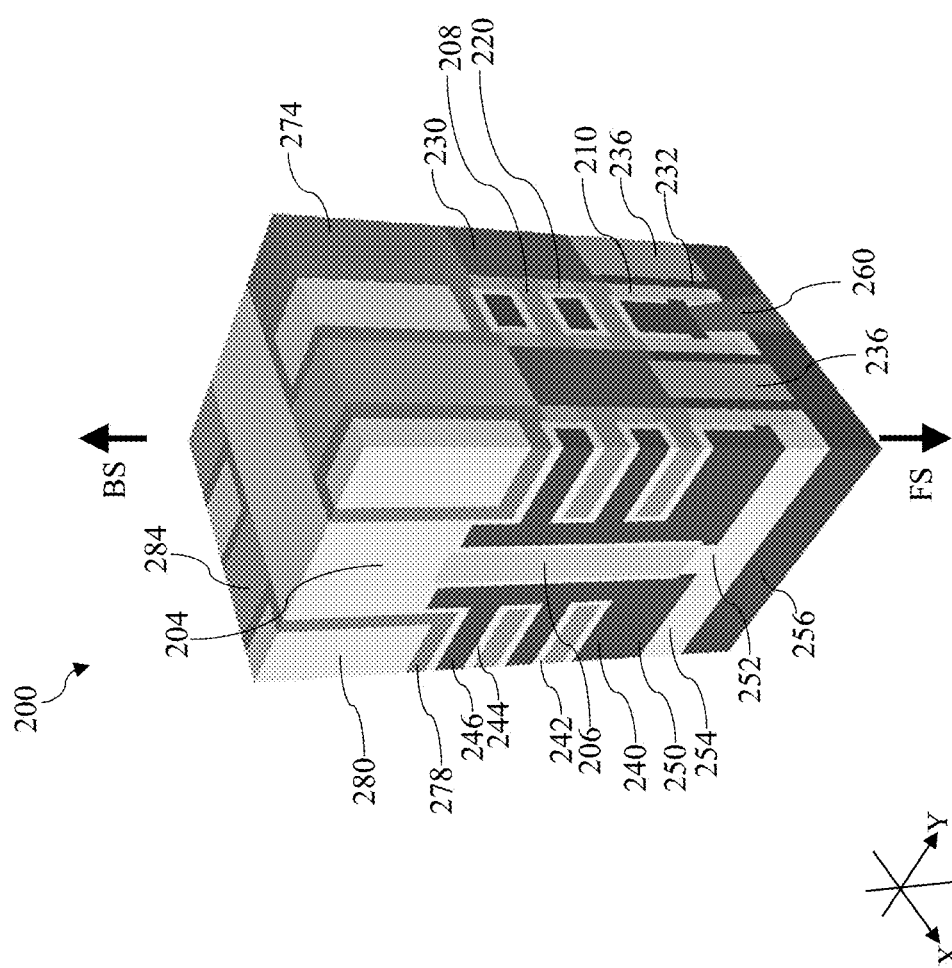

Referring to FIGS. 1, 10 and 11, method 100 includes a block 116 where the rest of the dummy epitaxial plugs 218 are replaced with dielectric plugs 284. Operations at block 116 may include selective removal of the sacrificial plugs 218 (shown in FIG. 10) and formation of the dielectric plugs 284 (shown in FIG. 11). In some embodiments, the removal of the sacrificial plug 218 may be self-aligned because the sacrificial plug 218, which is formed of silicon germanium (SiGe), is disposed among the isolation feature 204, the liner 278, the backside dielectric layer 280, and the backside source/drain contact 274. In these embodiments, the selective removal of the sacrificial plugs 218 may be performed using a selective wet etch process. An example selective wet etch process may include use of a solution of ammonium hydroxide ($NH_4OH$) and hydrogen peroxide ($H_2O_2$). Because the selective etch process at block 116 etches the sacrificial plug 218 faster than it etches the isolation feature 204, the liner 278, the backside dielectric layer 280, or the backside source/drain contact 274, the sacrificial plug 218 may be removed with little or no damages to the liner 278, the backside dielectric layer 280, and the backside source/drain contact 274. In the depicted embodiments, the selective removal of the sacrificial plug 218 may also remove a portion of the exposed source/drain feature 230 under the sacrificial plug 218. The removal of the sacrificial plug 218 forms second backside source/drain contact openings 282 to expose the source/drain features 230. Each of the second backside source/drain contact openings 282 are defined among the liner 278 and the isolation feature 204 while the first backside source/drain contact opening 272 shown in FIG. 6 is defined among the third mesa structure 202-3 and the isolation feature 204. Referring to FIG. 11, a dielectric material is then deposited over the back side BS of the workpiece 200 and the workpiece 200 is planarized to form the dielectric plugs 284 in the second backside source/drain contact openings 282. The dielectric material for the dielectric plugs 284 may include silicon nitride, silicon carbonitride, silicon oxycarbide, silicon oxycarbonitride, or other low-k dielectric materials that have a dielectric constant smaller than 7. It is noted that the dielectric plugs 284 and the backside dielectric layer 280 may not have the same composition or the backside dielectric layer 280 may not be selectively etched in a subsequent step. In some instances, as measured along the X direction, each of the sacrificial plug 218 may have a width between about 10 nm and about 30, which is similar to a width of the source/drain feature 230 along the X direction. Because silicon germanium has a dielectric constant greater than 11.7, replacing the sacrificial plugs 218 with dielectric plugs 284 help reduces parasitic capacitance between the to-be-formed backside gate contact and adjacent source/drain features 230.

Figure 12:
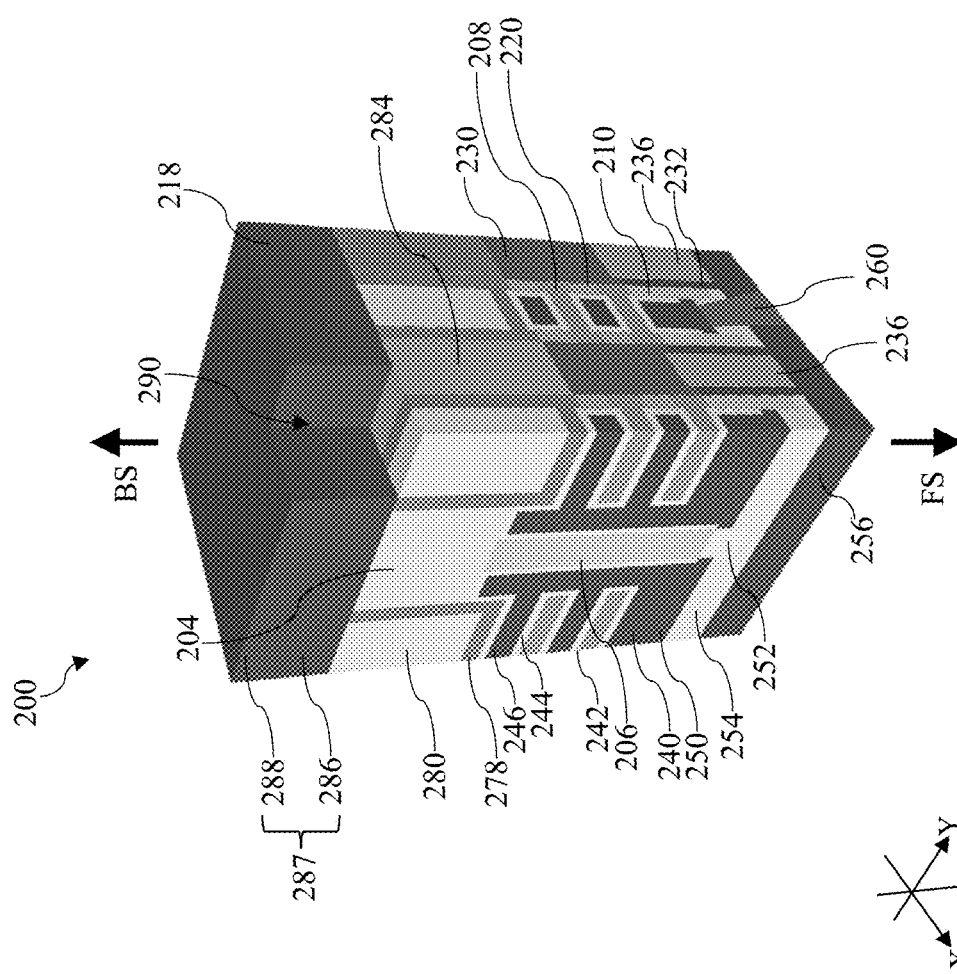

Referring to FIGS. 1 and 12, method 100 includes a block 118 where a second patterned hard mask 287 is formed to expose an area of the backside dielectric layer 280 directly over the gate structure 240. In an example process, a second hard mask layer 287 is blanketly deposited over the back side BS of the workpiece 200 using CVD. The second hard mask layer 287 may be a single layer or a multi-layer. In the depicted embodiment, the second hard mask layer 287 is a multi-layer and may include a metal hard mask layer 286 and a semiconductor nitride layer 288 over the metal hard mask layer 286. The metal hard mask layer 286 may include titanium nitride and the semiconductor nitride layer 288 may include silicon nitride. After a deposition of the second hard mask layer 287, photolithography and etch processes may be performed to pattern the second hard mask layer 287 to form the second patterned hard mask 287 to expose an area of the backside dielectric layer 280 directly over the gate structure 240. In some instances, a photoresist layer is deposited over the second hard mask layer 287. To pattern the photoresist layer, the photoresist layer is exposed to radiation reflected from or transmitting through a photomask, baked in a post-exposure bake process, and developed in a developer. The patterned photoresist layer is then applied as an etch mask to etch the second hard mask layer 287, thereby forming the second patterned hard mask 287. Referring to FIGS. 12, the second patterned hard mask 287 includes a second mask opening 290 that vertically aligned with an area of the backside dielectric layer 280 directly over the gate structure 240. According to the present disclosure, the second patterned hard mask 287 functions to mask off other areas of the backside dielectric layer 280 and the isolation feature 204.

Figure 13:
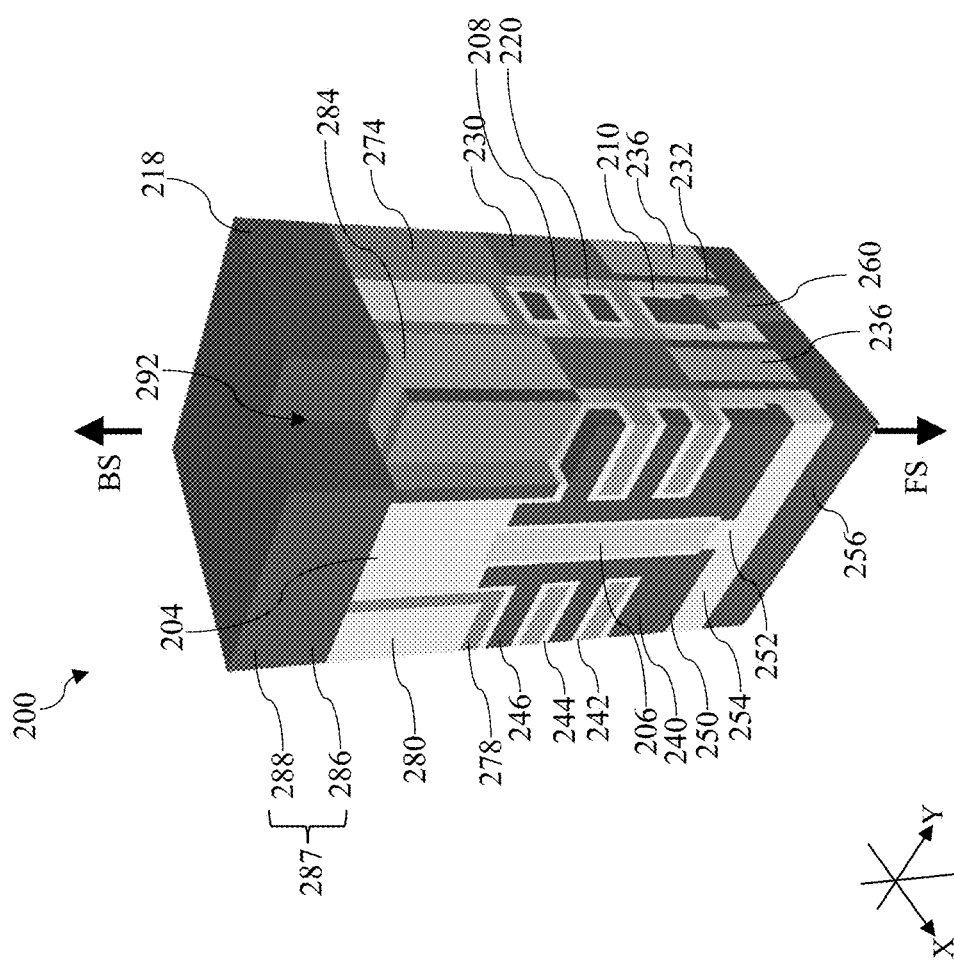

Referring to FIGS. 1 and 13, method 100 includes a block 120 where the backside dielectric layer 280 exposed in the second mask opening 290 is selectively removed to expose the gate structure 240 in a backside gate contact opening 292.

The selective removal of the backside dielectric layer 280 may be carried out using a dry etch process. An example selective dry etch process to etch back the mesa structures may include sulfur hexafluoride ($SF_6$), carbon tetrafluoride ($CF_4$), nitrogen trifluoride ($NF_3$), other fluorine-containing gas, oxygen ($O_2$), or a mixture thereof. In some embodiments where a composition of the dielectric plugs 284 or a composition of the liner 278 is different from a composition of the backside dielectric layer 280, it allows the exposed portion of the backside dielectric layer 280 to be selectively removed without damaging the liner 278 or the dielectric plug 284. In that regard, the removal of the backside dielectric layer 280 at block 120 is self-aligned. As shown in FIG. 13, the etch process at block 120 is performed until the gate electrode layer 246 of the gate structure 240 is exposed in the backside gate contact opening 292. That is, the etch process at block 120 also removes the gate dielectric layer 244 and the interfacial layer 242. After the formation of the backside gate contact opening 292, the second patterned hard mask layer 287 is removed by selective etching.

Figure 14:
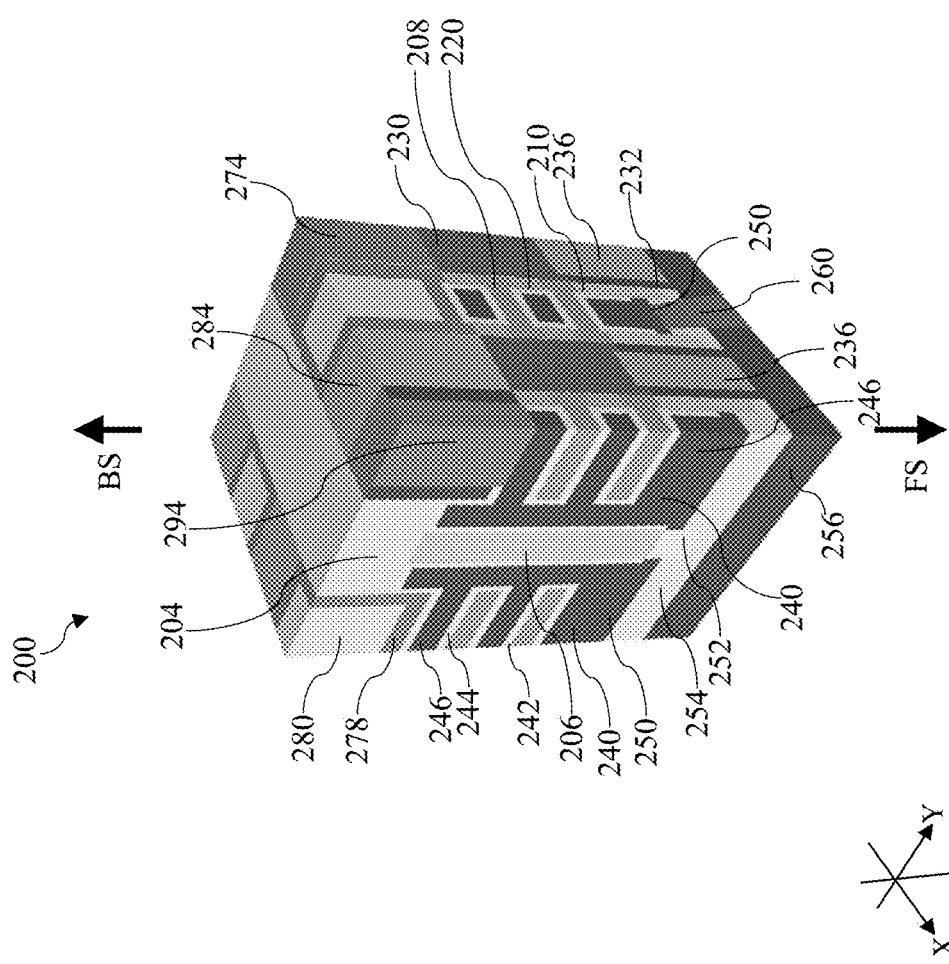
Figure 19:
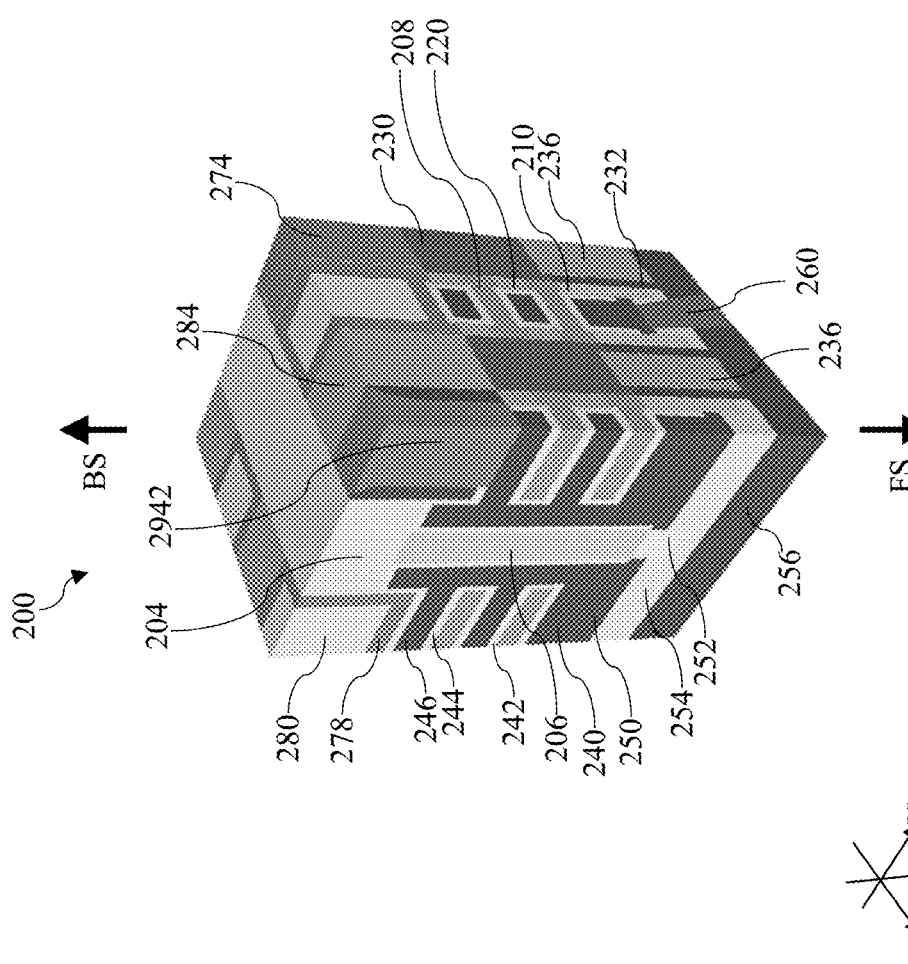

Referring to FIGS. 1 and 14, method 100 includes a block 122 where a backside gate contact 294 is formed in the backside gate contact opening 292. At block 122, a metal fill material may be deposited over the back side BS of the workpiece 200, including over the backside gate contact opening 292. The metal fill material may include tungsten (W), ruthenium (Ru), cobalt (Co), titanium (Ti), titanium nitride (TiN), tantalum (Ta), tantalum nitride (TaN), molybdenum (Mo), or aluminum (Al) and may be deposited using physical vapor deposition (PVD) or chemical vapor deposition (CVD). In some embodiments, the backside gate contact 294 may optionally include a barrier layer 295 (shown in FIG. 17) disposed along sidewalls of the backside gate contact 294. The optional barrier layer 295 may include silicon nitride or titanium nitride. A planarization process, such as a CMP process, may follow the deposition of the metal fill material to remove excess materials and provide a planar top surface. Upon conclusion of the operations at block 122, the backside gate contact 294 is coupled to and in direct contact with the gate electrode layer 246 of the gate structure 240. In some alternative embodiments, the etching at block 120 may also remove a portion of the gate electrode layer 246 and form a recess in the gate electrode layer 246. As a result, an extended backside gate contact 2940 shown in FIG. 18 may be formed. In still some other embodiments, the etching at block 120 also moderately etches the top edges of the liner 278 and a tapered backside gate contact 2942 shown in FIG. 19 may be formed. The tapered backside gate contact 2942 includes a smaller end surface adjacent the gate electrode layer 246 and a larger end surface away from the gate electrode layer 246, due to the chipping away of the liner 278. As measured from an interface with the gate electrode layer 246 to an interface with a backside conductive feature (described below), the backside gate contact 294 may have a height between about 6 nm and about 50 nm.

Figure 15:
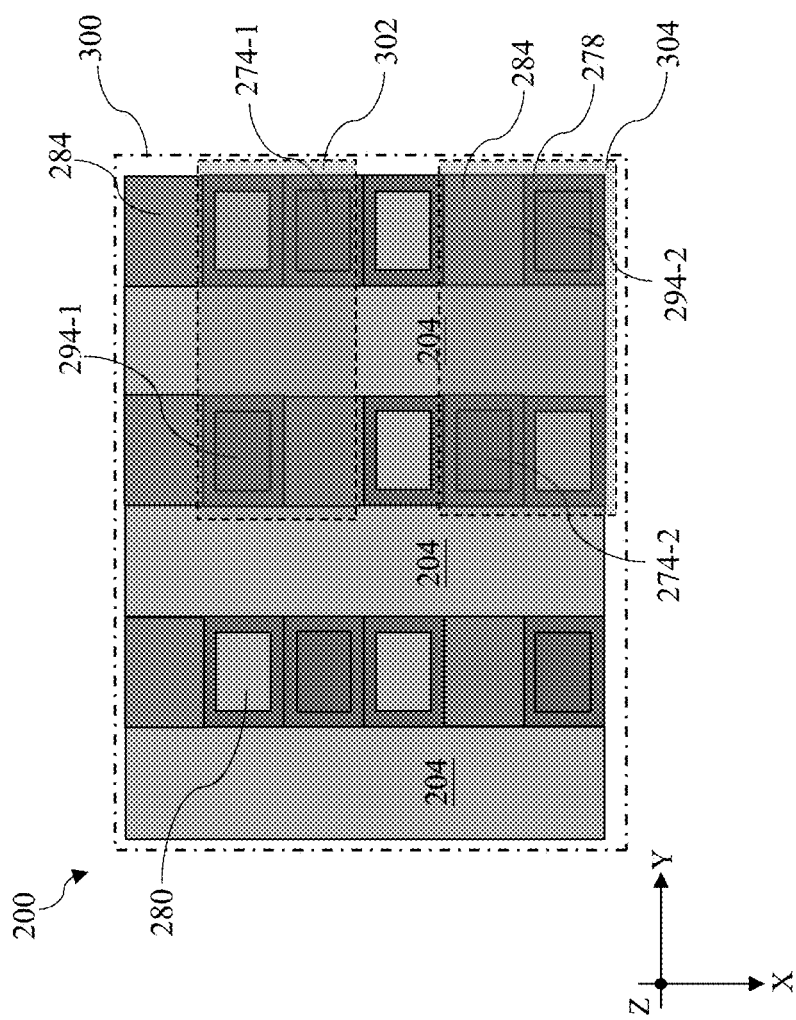
Figure 16:
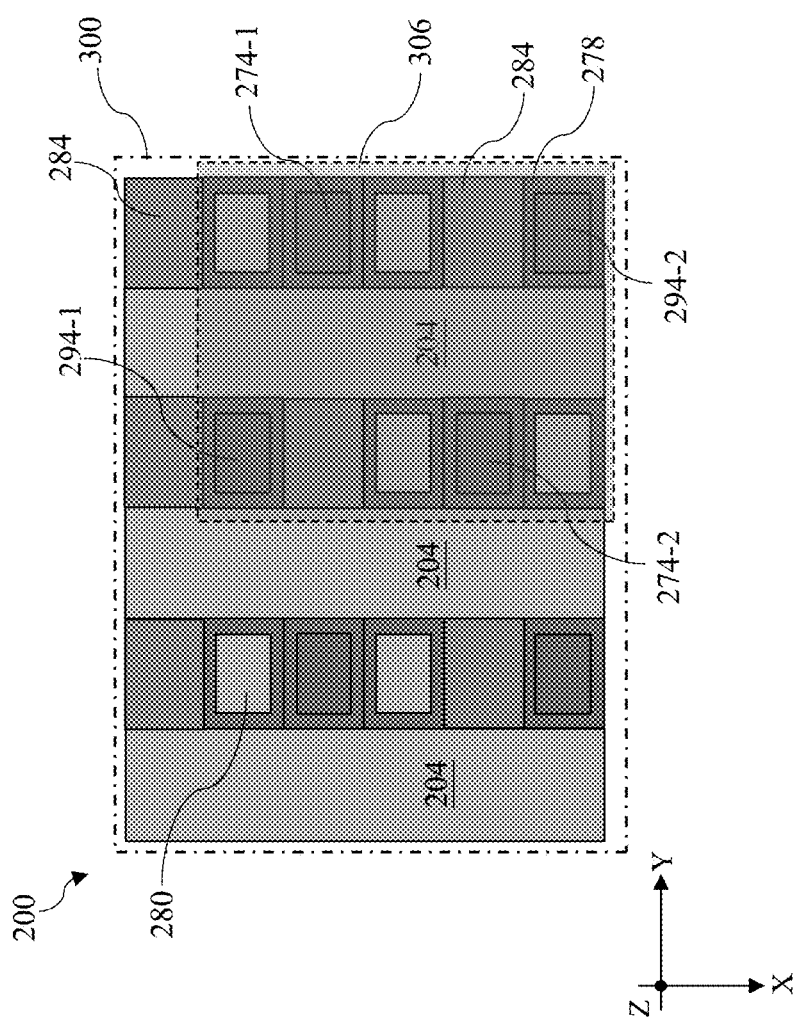
Figure 17:
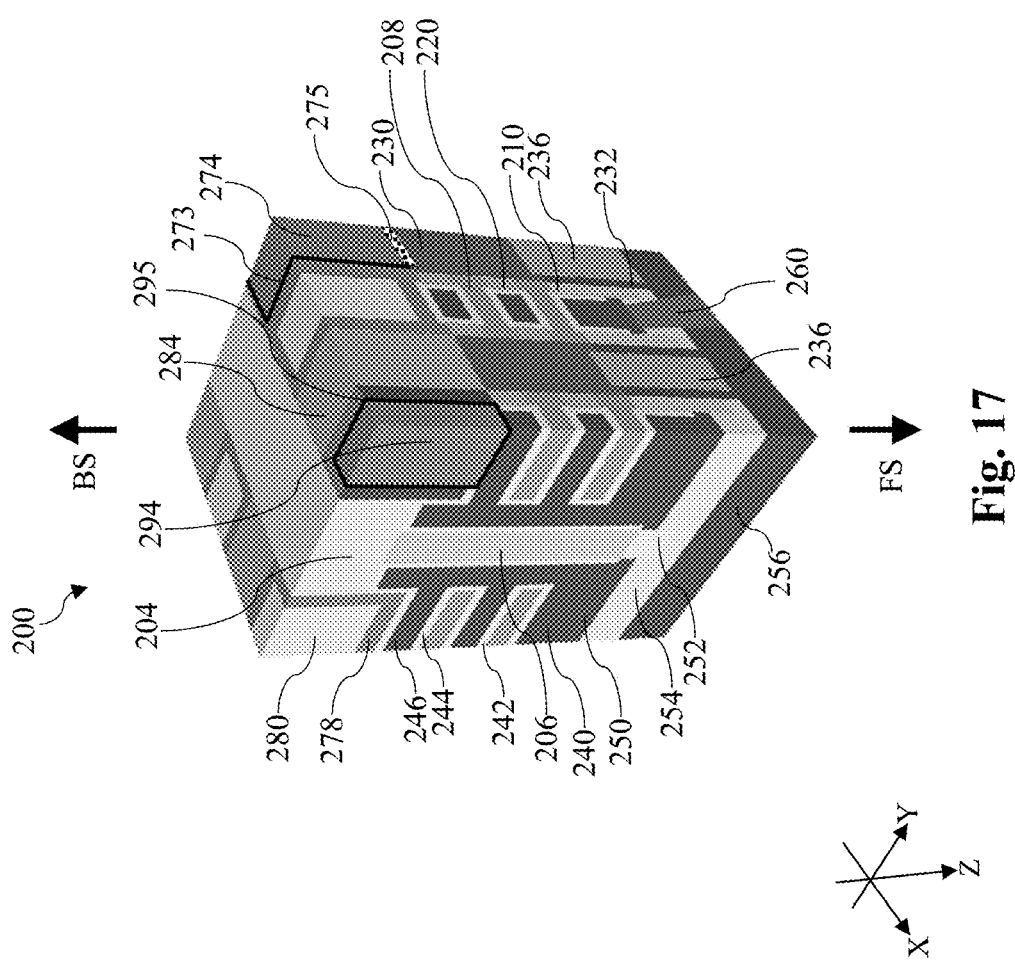
FIGS. 17-21 illustrate fragmentary perspective views of alternative semiconductor structures fabricated using the method of FIG. 1, according to one or more aspects of the present disclosure.

Referring to FIGS. 1, 15 and 16, method 100 includes a block 124 where at least one backside conductive feature to couple to the backside gate contact 294 and the backside source/drain contact 274. FIGS. 15 and 16 are fragmentary top view of the workpiece 200 shown in FIG. 14 and may include additional features, such as a first backside gate contact 294-1, a second backside gate contact 294-2, a first backside source/drain contact 274-1, and a second backside source/drain contact 274-2. Formation of the at least one backside conductive features may include deposition of an insulation layer 300, patterning the insulation layer 300 to form trenches, and formation of the at least one conductive features in the trenches. The insulation layer 300 may have a composition similar to that of the ILD layer described above. The insulation layer 300 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicate glass (BSG), and/or other suitable dielectric materials. The insulation layer 300 is deposited over the back side BS of the workpiece 200, including over the backside dielectric layer 280, the backside source/drain contacts, the isolation feature 204, the liner 278, and the backside gate contacts. Then, trenches are patterned in the insulation layer 300 to selectively expose the backside gate contacts 294 or the backside source/drain contacts 274. Thereafter, a metal fill material is deposited into the trenches to form the at least one backside conductive features. In some embodiments, the metal fill material in the at least one backside conductive feature may include titanium (Ti), tantalum (Ta), titanium nitride (TiN), tantalum nitride (TaN), ruthenium (Ru), tungsten (W), cobalt (Co), nickel (Ni), molybdenum (Mo), or a combination thereof. In some implementations, a barrier layer may be optionally deposited before the deposition of the metal fill material to separate the metal fill material from the insulation layer. The barrier layer may include titanium nitride (TiN), tantalum nitride (TaN), cobalt nitride (CoN), nickel nitride (NiN), or tungsten nitride (WN). When the barrier layer is formed, both the barrier layer and the metal fill material may be considered portions of the at least one backside conductive feature. The barrier layer and the metal fill layer may be deposited using PVD, CVD, ALD, or electroless plating. A planarization process, such as a CMP process, may be performed to remove excess materials over the insulation layer. While not explicitly shown, further interconnect structures may be formed over the insulation layer 300 and the at least one backside conductive feature.

In some embodiments represented in FIG. 15, the at least one backside conductive feature includes a first backside conductive feature 302 and a second backside conductive feature 304. The first backside conductive feature 302 are electrically coupled to the first backside gate contact 294-1 and the first backside source/drain contact 274-1, thereby interconnecting them. The second backside conductive feature 304 are electrically coupled to the second backside gate contact 294-2 and the second backside source/drain contact 274-2, thereby interconnecting them. Each of the first backside conductive feature 302 and the second backside conductive feature 304 spans over an isolation feature 204 along the Y direction. In FIG. 15, when viewed along the Z direction, the first backside gate contact 294-1 is spaced apart from the second backside source/drain contact 274-2 by the liner 278, the dielectric plug 284, and the backside dielectric layer 280. In some other embodiments represented in FIG. 16, the at least one backside conductive feature includes a third backside conductive feature 306. The third backside conductive feature 306 are electrically coupled to the first backside gate contact 294-1, the first backside source/drain contact 274-1, second backside gate contact 294-2 and the second backside source/drain contact 274-2, thereby interconnecting all of them.

Embodiments of the present disclosure provide advantages. For example, methods of the present disclosure form backside gate contacts that are directly coupled to the gate structure. The introduction of backside gate contacts makes possible further interconnect structure and routing on the backside of a semiconductor structure, thereby reducing the number of metal lines on the front side. For example, backside conductive features may locally connect a backside gate contact to a backside source/drain contact. Additionally, methods of the present disclosure replace semiconductor mesa structures with dielectric layers to reduce Off-state leakage current through or via the bulk substrate.

In one exemplary aspect, the present disclosure is directed to a semiconductor structure. The semiconductor structure includes first nanostructures, a first gate structure wrapping around each of the first nanostructures and disposed over an isolation structure, and a backside gate contact disposed below the first nanostructures and adjacent to the isolation structure. A bottom surface of the first gate structure is in direct contact with the backside gate contact.

In some embodiments, the semiconductor structure may further include second nanostructures, a second gate structure wrapping around each of the second nanostructures and disposed over the isolation structure, and a frontside gate contact disposed over the second nanostructures and away from the isolation structure. The second gate structure is electrically coupled to the frontside gate contact. In some implementations, the frontside gate contact is electrically coupled to the second gate structure by way of a gate cap layer. In some instances, the semiconductor structure may further include a first source/drain feature coupled to end surfaces of the second nanostructures, and a backside source/drain contact disposed below the second nanostructures and adjacent to the isolation structure. The backside source/drain contact is electrically coupled to the first source/drain feature. In some embodiments, the semiconductor structure may further include a second source/drain feature coupled to and sandwiched between the first nanostructures and the second nanostructures and a dielectric plug disposed below the second source/drain feature. The dielectric plug is adjacent the isolation structure and the backside gate contact. In some embodiments, the semiconductor structure may further include a liner extending from between the backside gate contact and the isolation structure to between the backside gate contact and the dielectric plug. In some instances, the dielectric plug and the isolation structure include silicon oxide and the liner includes silicon nitride. In some embodiments, the second nanostructures are disposed over a backside dielectric layer. In some implementations, the backside dielectric layer is spaced apart from the dielectric plug and the isolation structure by a liner. In some instances, the dielectric plug and the backside dielectric layer include silicon oxide and the liner includes silicon nitride.

In another exemplary aspect, the present disclosure is directed to a semiconductor structure. The semiconductor structure includes a first plurality of nanostructures, a first gate structure wrapping around each of the first plurality of nanostructures, a first cap layer disposed on a top surface of the first gate structure, a backside gate contact in direct contact with a bottom surface of the first gate structure, the bottom surface being opposite the top surface, a second plurality of nanostructures, a second gate structure wrapping around each of the second plurality of nanostructures, a second cap layer disposed on the second gate structure, and a frontside gate contact in direct contact with second cap layer.

In some embodiments, the backside gate contact partially extends into the first gate structure. In some implementations, the semiconductor structure may further include a first source/drain feature disposed between and in direct contact with the first plurality of nanostructures and the second plurality of nanostructures and a second source/drain feature in direct contact with the second plurality of nanostructures. The second plurality of nanostructures extend between the first source/drain feature and the second source/drain feature. In some implementations, the semiconductor structure may further include a dielectric plug disposed below the first source/drain feature and a backside source/drain contact disposed below the second source/drain feature. In some instances, the dielectric plug is spaced apart from the backside gate contact by a liner. The dielectric plug includes silicon oxide and the liner includes silicon nitride. In some embodiments, the backside source/drain contact partially extends into the second source/drain feature.

In yet another exemplary aspect, the present disclosure is directed to a method. The method includes receiving a workpiece that includes first nanostructures disposed over a first mesa structure, second nanostructure disposed over a second mesa structure, a first gate structure wrapping around the first nanostructures, a second gate structure wrapping around the second nanostructures, a first source/drain feature sandwiched between the first nanostructures and the second nanostructures, a second source/drain feature spaced apart from the first source/drain feature by the second nanostructures, a first dummy epitaxial plug below the first source/drain feature and between the first mesa structure and the second mesa structure, and a second dummy epitaxial plug below the second source/drain feature and adjacent the second mesa structure. The method further includes replacing the second dummy epitaxial plug with a backside source/drain contact, replacing the first mesa structure with a backside dielectric feature, replacing the first dummy epitaxial plug with a dielectric plug, and replacing the backside dielectric feature with a backside gate contact in direct contact with the first gate structure.

In some embodiments, the first mesa structure and the second mesa structure include silicon. The first dummy epitaxial plug and the second dummy epitaxial plug include silicon germanium. In some implementations, the replacing of the first mesa structure includes selectively removing the first mesa structure, depositing a liner over the workpiece, and after the depositing of the liner, forming the backside dielectric feature over the liner. In some instances, the replacing the backside dielectric feature includes selectively removing the backside dielectric feature, after the selectively removing of the backside dielectric feature, anisotropically etching the liner to form a backside gate contact opening to expose the first gate structure, and forming the backside gate contact in the backside gate contact opening.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   first nanostructures;
   a first gate structure wrapping around each of the first nanostructures and disposed over an isolation structure;
   a dielectric fin disposed on the isolation structure and in contact with a sidewall of the first gate structure; and
   a backside gate contact disposed below the first nanostructures and adjacent to the isolation structure,
   wherein a bottom surface of the first gate structure is in direct contact with the backside gate contact.

2. The semiconductor structure of claim 1, further comprising:
   second nanostructures;
   a second gate structure wrapping around each of the second nanostructures and disposed over the isolation structure; and
   a frontside gate contact disposed over the second nanostructures and away from the isolation structure,
   wherein the second gate structure is electrically coupled to the frontside gate contact.

3. The semiconductor structure of claim 2, wherein the frontside gate contact is electrically coupled to the second gate structure by way of a gate cap layer.

4. The semiconductor structure of claim 2, further comprising:
   a first source/drain feature coupled to end surfaces of the second nanostructures; and
   a backside source/drain contact disposed below the second nanostructures and adjacent to the isolation structure,
   wherein the backside source/drain contact is electrically coupled to the first source/drain feature.

5. The semiconductor structure of claim 2, further comprising:
   a second source/drain feature coupled to and sandwiched between the first nanostructures and the second nanostructures; and
   a dielectric plug disposed below the second source/drain feature,
   wherein the dielectric plug is adjacent the isolation structure and the backside gate contact.

6. The semiconductor structure of claim 5, further comprising:
   a liner extending from between the backside gate contact and the isolation structure to between the backside gate contact and the dielectric plug.

7. The semiconductor structure of claim 6,
   wherein the dielectric plug and the isolation structure comprise silicon oxide,
   wherein the liner comprises silicon nitride.

8. The semiconductor structure of claim 5, wherein the second nanostructures are disposed over a backside dielectric layer.

9. The semiconductor structure of claim 8, wherein the backside dielectric layer is spaced apart from the dielectric plug and the isolation structure by a liner.

10. The semiconductor structure of claim 9,
    wherein the dielectric plug and the backside dielectric layer comprise silicon oxide,
    wherein the liner comprises silicon nitride.

11. A semiconductor structure, comprising:
    a first plurality of nanostructures;
    a first gate structure wrapping around each of the first plurality of nanostructures;
    a first cap layer disposed on a top surface of the first gate structure;
    a backside gate contact in direct contact with a bottom surface of the first gate structure, the bottom surface being opposite the top surface;
    a second plurality of nanostructures;
    a second gate structure wrapping around each of the second plurality of nanostructures;
    a second cap layer disposed on the second gate structure; and
    a frontside gate contact in direct contact with second cap layer.

12. The semiconductor structure of claim 11, wherein the backside gate contact partially extends into the first gate structure.

13. The semiconductor structure of claim 11, further comprising:
    a first source/drain feature disposed between and in direct contact with the first plurality of nanostructures and the second plurality of nanostructures; and a second source/drain feature in direct contact with the second plurality of nanostructures,
wherein the second plurality of nanostructures extend between the first source/drain feature and the second source/drain feature.

14. The semiconductor structure of claim 13, further comprising:
a dielectric plug disposed below the first source/drain feature; and
a backside source/drain contact disposed below the second source/drain feature.

15. The semiconductor structure of claim 14,
wherein the dielectric plug is spaced apart from the backside gate contact by a liner,
wherein the dielectric plug comprises silicon oxide,
wherein the liner comprises silicon nitride.

16. The semiconductor structure of claim 14, wherein the backside source/drain contact partially extends into the second source/drain feature.

17. A method, comprising:
receiving a workpiece comprising:
first nanostructures disposed over a first mesa structure,
second nanostructure disposed over a second mesa structure,
a first gate structure wrapping around the first nanostructures;
a second gate structure wrapping around the second nanostructures,
a first source/drain feature sandwiched between the first nanostructures and the second nanostructures,
a second source/drain feature spaced apart from the first source/drain feature by the second nanostructures,
a first dummy epitaxial plug below the first source/drain feature and between the first mesa structure and the second mesa structure, and
a second dummy epitaxial plug below the second source/drain feature and adjacent the second mesa structure;
replacing the second dummy epitaxial plug with a backside source/drain contact;
replacing the first mesa structure with a backside dielectric feature;
replacing the first dummy epitaxial plug with a dielectric plug; and
replacing the backside dielectric feature with a backside gate contact in direct contact with the first gate structure.

18. The method of claim 17,
wherein the first mesa structure and the second mesa structure comprise silicon,
wherein the first dummy epitaxial plug and the second dummy epitaxial plug comprise silicon germanium.

19. The method of claim 17, wherein the replacing of the first mesa structure comprises:
selectively removing the first mesa structure;
depositing a liner over the workpiece; and
after the depositing of the liner, forming the backside dielectric feature over the liner.

20. The method of claim 19, wherein the replacing the backside dielectric feature comprises:
selectively removing the backside dielectric feature;
after the selectively removing of the backside dielectric feature, anisotropically etching the liner to form a backside gate contact opening to expose the first gate structure; and
forming the backside gate contact in the backside gate contact opening.

* * * * *